(12) United States Patent
Yoshimochi

(10) Patent No.: US 8,193,579 B2
(45) Date of Patent: Jun. 5, 2012

(54) TRENCH TYPE SEMICONDUCTOR DEVICE AND FABRICATION METHOD FOR THE SAME

(75) Inventor: Kenichi Yoshimochi, Kyoto (JP)

(73) Assignee: Rohm Co., Ltd. (JP)

( * ) Notice: Subject to any disclaimer, the term of this patent is extended or adjusted under 35 U.S.C. 154(b) by 42 days.

(21) Appl. No.: 12/511,458

(22) Filed: Jul. 29, 2009

(65) Prior Publication Data

US 2010/0025759 A1 Feb. 4, 2010

(30) Foreign Application Priority Data

Jul. 29, 2008 (JP) ................................. 2008-194805
Sep. 5, 2008 (JP) ................................. 2008-229028

(51) Int. Cl.
*H01L 29/66* (2006.01)
*H01L 29/78* (2006.01)

(52) U.S. Cl. ........ 257/331; 257/332; 257/333; 257/334; 257/E29.118; 257/E29.131

(58) Field of Classification Search .................. 257/329, 257/330, 331, 332, 333, 334, E29.118, E29.131
See application file for complete search history.

(56) References Cited

U.S. PATENT DOCUMENTS

| | | | | |
|---|---|---|---|---|
| 2008/0211016 A1* | 9/2008 | Boden | ............................ | 257/330 |
| 2008/0217684 A1* | 9/2008 | Hashimoto et al. | ............ | 257/334 |
| 2008/0246081 A1* | 10/2008 | Li et al. | ........................... | 257/331 |
| 2008/0246082 A1* | 10/2008 | Hshieh | ........................... | 257/333 |
| 2008/0265315 A1* | 10/2008 | Mauder et al. | ................. | 257/330 |
| 2009/0026533 A1* | 1/2009 | Hshieh | ........................... | 257/330 |
| 2009/0057756 A1* | 3/2009 | Hshieh | ........................... | 257/330 |
| 2009/0057757 A1* | 3/2009 | Hokomoto et al. | ............ | 257/330 |
| 2009/0085107 A1* | 4/2009 | Hshieh | ........................... | 257/331 |
| 2009/0212358 A1* | 8/2009 | Shiraishi et al. | ............... | 257/330 |
| 2009/0212359 A1* | 8/2009 | Hsieh | ............................. | 257/331 |
| 2009/0267143 A1* | 10/2009 | Hsieh | ............................. | 257/331 |
| 2009/0283798 A1* | 11/2009 | Tsuzuki et al. | ................ | 257/140 |
| 2009/0302381 A1* | 12/2009 | Pan | .................................. | 257/332 |
| 2009/0309156 A1* | 12/2009 | Darwish et al. | ................ | 257/332 |
| 2009/0315106 A1* | 12/2009 | Hsieh | ............................. | 257/334 |
| 2010/0006928 A1* | 1/2010 | Pan et al. | ....................... | 257/330 |
| 2010/0013009 A1* | 1/2010 | Pan | .................................. | 257/330 |
| 2010/0140694 A1* | 6/2010 | Tu et al. | ......................... | 257/333 |

FOREIGN PATENT DOCUMENTS

JP 9-321303 A 12/1997

* cited by examiner

*Primary Examiner* — Ngan Ngo
(74) *Attorney, Agent, or Firm* — Cantor Colburn LLP

(57) ABSTRACT

The trench type semiconductor device includes a gate insulating film placed on the bottom surface and the sidewall surface of the trench formed from the surface of a first base layer; a gate electrode placed on the gate insulating film and fills up into a trench; an interlayer insulating film covering the gate electrode; a second base layer placed on the surface of the first base layer, and is formed more shallowly than the bottom surface of the trench; a source layer placed on the surface of the second base layer; a source electrode connected to the second base layer in the bottom surface of a self-aligned contact trench formed in the second base layer by applying the interlayer insulating film as a mask, and is connected to the source layer in the sidewall surface; a drain layer placed at the back side of the first base layer; and a drain electrode placed at the drain layer, for achieving the minute structure by the self-alignment, reducing the on resistance, and improving the breakdown capability, and providing a fabrication method for the same.

12 Claims, 19 Drawing Sheets

TRENCH TYPE SEMICONDUCTOR DEVICE AND FABRICATION METHOD FOR THE SAME

CROSS REFERENCE TO RELATED APPLICATIONS AND INCORPORATION BY REFERENCE

This application is based upon and claims the benefit of priority from prior Japanese Patent Applications No. P2008-194805 filed on Jul. 29, 2008, and No. P2008-229028 filed on Sep. 5, 2008, the entire contents of which are incorporated herein by reference.

TECHNICAL FIELD

The present invention relates to a trench type semiconductor device and a fabrication method for the trench type semiconductor device. More specifically, the present invention relates to a trench type semiconductor device which achieves minute structure by a fully self-aligned, reduces the on resistance, and improves breakdown capability, and a fabrication method for the same.

BACKGROUND ART

Conventionally, trench type semiconductor devices, such as a vertical MOSFET (Metal Oxide Semiconductor Field Effect Transistor) and IGBT (Insulated Gate Bipolar Transistor) with which a trench is formed in a substrate and a gate electrode is formed in the trench, and a fabrication method for the same are known. In such a trench type semiconductor device, an interlayer insulating film is formed so that an apertural area of the trench may be filled up. An electrode inside the trench and an external electrode are insulated by the interlayer insulating film.

A trench type MOS transistor including a n type silicon substrate in which a trench is formed, a polysilicon gate formed in the inside of the trench, and a local oxidation film (interlayer insulating film) formed in the top surface of the n type silicon substrate is disclosed in Patent Literature 1.

A high-concentration p type bulk layer formed in the both ends sandwiching the trench, a low-concentration p type bulk layer formed between the p type bulk layer and the trench, and a n type source layer formed in the upper layer of the p type bulk layer are formed in the n type silicon substrate. A part of local oxidation film is formed also between the internal wall surface of the trench and the polysilicon gate.

In the fabrication method of the MOS transistor described in Patent Literature 1, after forming the p type bulk layer in the n type silicon substrate, a silicon nitride film and a low temperature oxidation film for forming the patterned trench are formed. Next, after forming the trench, the low temperature oxidation film is removed. Next, the polysilicon gate is formed in the trench.

Next, the local oxidation film is formed on the polysilicon gate by annealing based on a LOCOS (Local Oxidation of Silicon) method. Then, after removing the silicon nitride film, an ion implantation of a p type impurity and a n type impurity is performed to sequentially, and the low-concentration p type bulk layer and n type bulk layer are formed. In this case, since a thin thermally oxidation film remains on the top surface of the layer which forms the low-concentration p type bulk layer and n type bulk layer, the impurity ions are implanted with the accelerating energy of the level which passes through the thin thermally oxidation film. Accordingly, many of the implanted ions pass through the thick local oxidation film on the polysilicon gate, and do not remain in the inside of the local oxidation film. Accordingly, the MOS transistor described in Patent Literature 1 is completed.

However, the MOS transistor described in Patent Literature 1 performs the segregation of the top surface of the polysilicon gate and forms the local oxidation film by annealing. Accordingly, there was a subject that it is not easy to apply thickness of the level that the polysilicon gate can be insulated by the local oxidation film. In order to make the local oxidation film into the thickness which can be insulated in this way, although the method of heat treatment of high temperature or long duration can be considered, another problem of degrading the element characteristic of the fabricated MOS transistor occurs in these methods.

Furthermore, in the MOSFET, the IGBT, etc. having the trench type gate structure, when forming electric contact at a base layer and an emitter layer or a source layer between trench—trench, it was difficult to secure a contact area with the miniaturization of device structure. Accordingly, there was a problem that the on resistance increases and the breakdown capability reduces with the reduction of the contact area.

CITATION LIST

Patent Literature 1: Japanese Patent Application Laying-Open Publication No. H09-321303

SUMMARY OF THE INVENTION

Technical Problem

The purpose of the present invention is to provide a trench type semiconductor device which achieves minute structure by a self-alignment, reduces the on resistance, and improves the breakdown capability, and a fabrication method for the trench type semiconductor device.

The purpose of the present invention is to provide a trench type semiconductor device which can thicken an interlayer insulating film easily, and a fabrication method for the trench type semiconductor device.

Solution to Problem

According to one aspect of the present invention for achieving the above-mentioned purpose, a trench type semiconductor device comprises a first base layer of a first conductivity type having high resistivity; a gate insulating film placed on a bottom surface and a sidewall surface of a trench formed from a surface of the first base layer; a gate electrode placed on the gate insulating film and fills up into the trench; an interlayer insulating film placed by covering the gate electrode; a second base layer of a second conductivity type placed on the surface of the first base layer, and is formed more shallowly than a bottom surface of the trench; a first main electrode layer of the first conductivity type placed on a surface of the second base layer; a first main electrode which passes through the first main electrode layer by applying the interlayer insulating film as a mask, is connected to the second base layer in a bottom surface of a self-aligned contact trench formed in the second base layer, and is connected to the first main electrode layer in the sidewall surface of the self-aligned contact trench; a second main electrode layer placed at a back side of the first base layer; and a second main electrode placed at the second main electrode layer.

According to another aspect of the present invention, a fabrication method for a trench type semiconductor device comprises forming a first base layer of a first conductivity type with high resistivity; forming a gate insulating film on a bottom surface and a sidewall surface of a trench formed from a surface of the first base layer; forming the gate electrode for filling up into the trench on the gate insulating film; covering the gate electrode and forming an interlayer insulating film; forming a second base layer of a second conductivity type on the surface of the first base layer formed more shallowly than the bottom surface of the trench; forming a first main electrode layer of the first conductivity type on a surface of the second base layer; forming a first main electrode which passes through the first main electrode layer by applying the interlayer insulating film as a mask, is connected to the second base layer in the bottom surface of a self-aligned contact trench formed in the second base layer, and is connected to the first main electrode layer in a sidewall surface of the self-aligned contact trench; forming a second main electrode layer at a back side of the first base layer; and forming a second main electrode at the second main electrode layer.

Advantageous Effects of Invention

According to the present invention, the trench type semiconductor device which achieves the minute structure by the self-alignment, reduces the on resistance, and improves the breakdown capability, and the fabrication method for the trench type semiconductor device can be provided.

According to the present invention, the interlayer insulating film includes the impurity consisting of the semiconductor material and the different element from its semiconductor material, and the impurity concentration of the interlayer insulating film is made larger than the impurity concentration of the semiconductor region formed in the substrate. Accordingly, the volume capacity of the interlayer insulating film is increased easily and the interlayer insulating film can be formed thickly.

DESCRIPTION OF EMBODIMENTS

Figure 1:
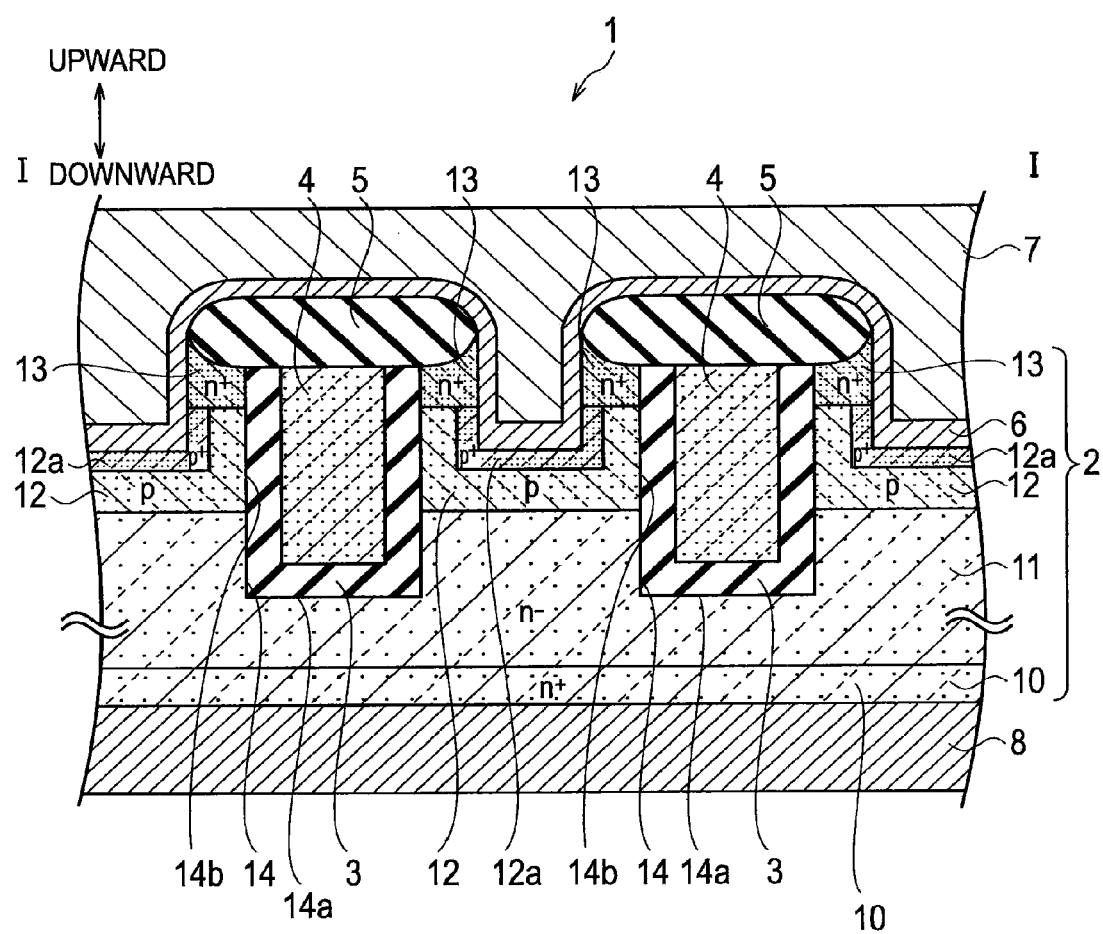
FIG. 1 is a schematic cross-sectional configuration diagram of a trench type semiconductor device according to a first embodiment of the present invention.

Next, embodiments of the invention will be described with reference to drawings. It explains simple by attaching the same reference numeral as the same block or element to below, and avoiding duplication of description. Drawings are schematic, not actual, and may be inconsistent in between in scale, ratio, etc.

The embodiments shown in the following exemplify the device and method for materializing the technical idea of this invention, and these embodiments of the invention do not specify assignment of each component parts, etc. as the following. Various changes can be added to the technical idea of the present invention in scope of claims.

A trench type semiconductor device according to embodiments of the present invention is targeting the MOSFET or the IGBT. In the case of the MOSFET, a first main electrode layer 13 forms a source layer, a second main electrode layer 10 forms a first conductivity type drain layer same as the first main electrode layer 13, a first main electrode 7 forms a source electrode, and a second main electrode 8 forms a drain electrode. In the case of the IGBT, the first main electrode layer 13 forms an emitter layer, the second main electrode layer 10 forms a second conductivity type collector layer opposite to the first main electrode layer 13, the first main electrode 7 forms an emitter electrode, and the second main electrode 8 forms a collector electrode.

In the following explanation, although MOSFET is mainly explained, if it assumes that the conductivity type of the second main electrode layer 10 becomes opposite, and what is necessary is just to change the name of each main electrode, about the IGBT can also be considered to be the MOSFET the same way.

First Embodiment (Element Structure)

Figure 2:
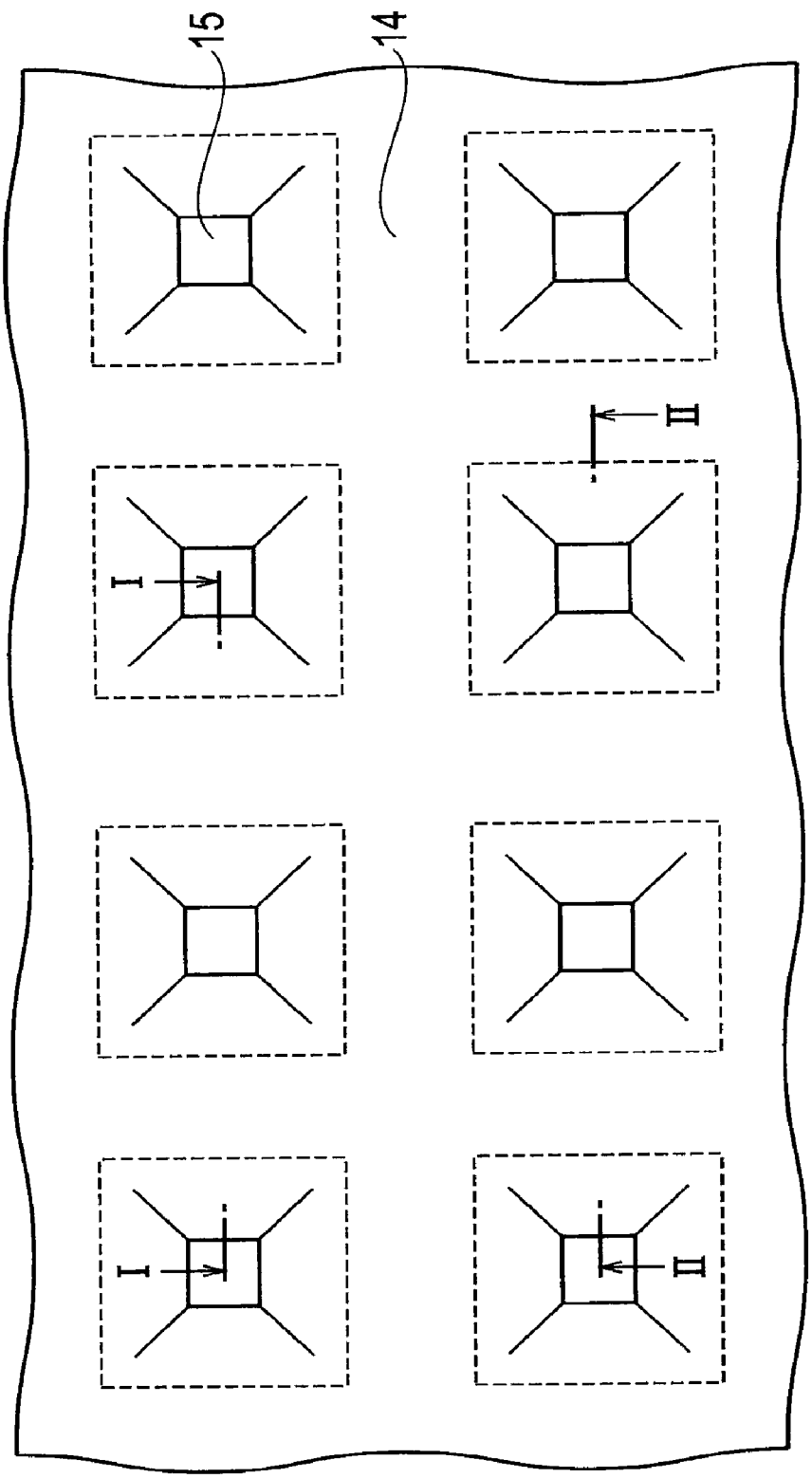
FIG. 2 is a lattice-like plane pattern configuration diagram of the trench type semiconductor device according to the first embodiment of the present invention.

A schematic cross-section structure of a trench type semiconductor device according to a first embodiment of the present invention is expressed as shown in FIG. 1. Moreover, a lattice-like plane pattern configuration of the trench type semiconductor device according to the first embodiment is expressed as shown in FIG. 2. FIG. 1 corresponds to the schematic cross-section structure taken in the line I-I of FIG. 2.

As shown in FIG. 1, the trench type semiconductor device according to the first embodiment of the present invention includes: a $n^-$ type first base layer 11; a gate insulating film 3 placed on a bottom surface 14a and a sidewall surface 14b of a trench 14 formed from the surface of the $n^-$ type first base layer 11; a gate electrode 4 which is placed on the gate insulating film 3 and fills up into the trench 14; an interlayer insulating film 5 which is placed by covering the gate electrode 4; a p type second base layer 12 which is placed on the surface of the $n^-$ type first base layer 11, and is formed more shallowly than the bottom surface 14a of the trench 14; a $n^+$ type source layer 13 placed on the surface of the p type second base layer 12; a source electrode 7 which passes through the $n^+$ type source layer 13 by applying the interlayer insulating film 5 as the mask, is connected to the p type second base layer 12 in a bottom surface 15a of a self-aligned contact trench 15 formed in the p type second base layer 12, and is connected to the $n^+$ type source layer 13 in a sidewall surface 15b of the self-aligned contact trench 15; a $n^+$ type drain layer 10 placed at the back side of the $n^-$ type first base layer 11; and a drain electrode 8 placed at the back side of the $n^+$ type drain layer 10.

The bottom surface 15a of the self-aligned contact trench 15 may be provided with a body contact layer 12a with $p^+$ type whose impurity concentration is higher than the p type second base layer 12.

In addition, the first base layer 11 is started from the substrate 2, becomes thin with the formation of the second base layer 12, the source layer 13, and the drain layer 10, and has predetermined thickness in a final completion device. Therefore, in the completion device structure shown in FIG. 1, the substrate 2 is expressed as a layer including the first base layer 11, the second base layer 12, the source layer 13, and the drain layer 10.

As shown in FIG. 1, the interlayer insulating film 5 is formed with a LOCOS oxidation film, and is placed by covering a part of the gate insulating film 3 and a part of the source layer 13.

The bottom surface 15a of the self-aligned contact trench 15 may be provided with the body contact layer 12a whose impurity concentration is higher than the second base layer 12, as shown in FIG. 1.

The source electrode 7 may be placed all over the device surface, as shown in FIG. 1.

Moreover, the source electrode 7 may provide with a barrier metal layer 6 on the underlying, as shown in FIG. 1.

Since the first base layer 11 and the second base layer 12 are advantageous in respect of the degree of electron transfer, the surface orientation may be (100).

The trench 14 which passes through the source layer 13 and the second base layer 12, and is formed in the first base layer 11 from the surface of the source layer 13 has a rectangular plane pattern, for example.

Since the bottom surface 14a and the sidewall surface 14b of the trench 14 are advantageous in respect of the degree of electron transfer, both the bottom surface 14a and the sidewall surface 14b may have the surface orientation of (100) or the surface in parallel to (100).

Since the bottom surface 15a and the sidewall surface 15b of the self-aligned contact trench 15 are advantageous in respect of the degree of electron transfer, both the bottom surface 15a and the sidewall surface 15b may have the surface orientation of (100) or the surface in parallel to (100).

Figure 3:
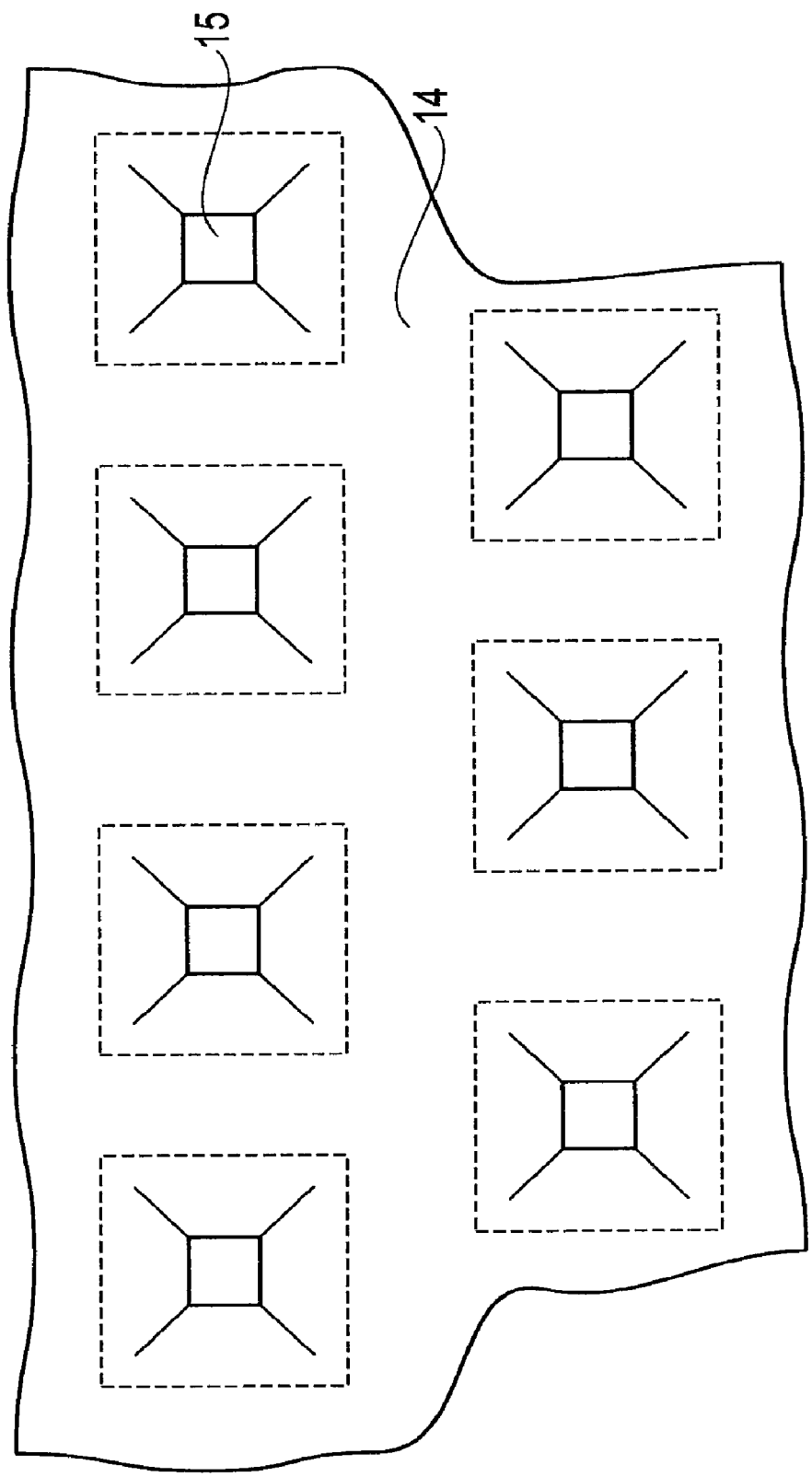
FIG. 3 is a zigzagged lattice-like plane pattern configuration diagram of the trench type semiconductor device according to the first embodiment of the present invention.

The self-aligned contact trench 15 has a lattice-like pattern as shown in FIG. 2, or a zigzagged lattice-like pattern as shown in FIG. 3.

Figure 4:
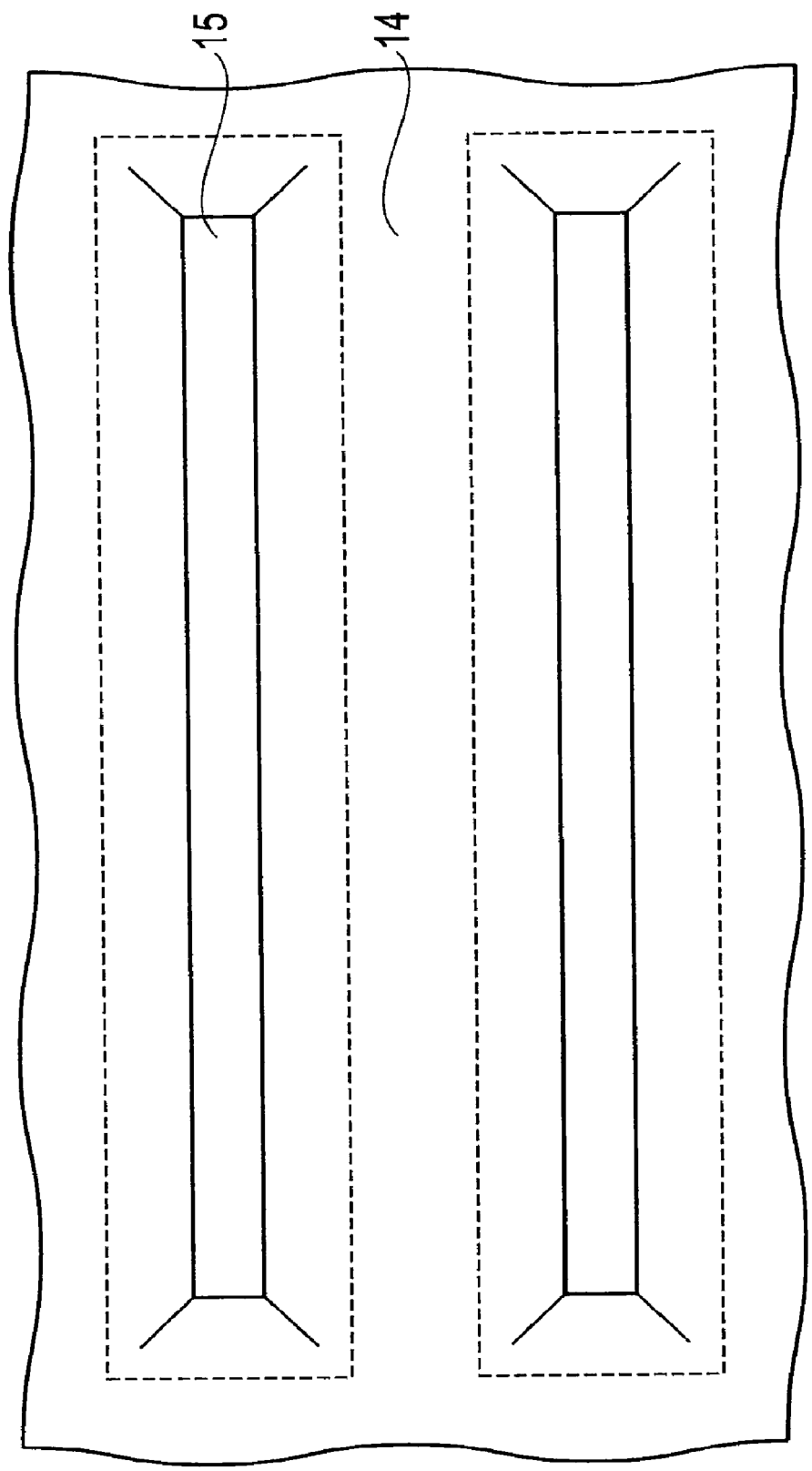
FIG. 4 is a stripe shape plane pattern configuration diagram of the trench type semiconductor device according to the first embodiment of the present invention.

The lattice-like pattern as shown in FIG. 2 is used for the trench type semiconductor device according to the first embodiment by adjusting an exposure value. The lattice-like pattern as shown in FIG. 2 tends to occur "a pattern becoming blunt (sagging)" according to the variation in the exposure value in particular in the intersection of the pattern of the trench 14. In a part of the pattern becoming blunt (sagging) occurred, it is easy to generate the surfaces, which are different from the surface orientation of (100), in the internal wall surfaces of the trench. As for the zigzagged lattice-like pattern as shown in FIG. 3, since the pattern of the trench 14 is placed by shifting to the zigzagged lattice-like, it is hard to occur the pattern becoming blunt (sagging) according to the variation in the exposure value. Moreover, the self-aligned contact trench 15 may be formed in stripe shape as shown in FIG. 4.

Figure 5:
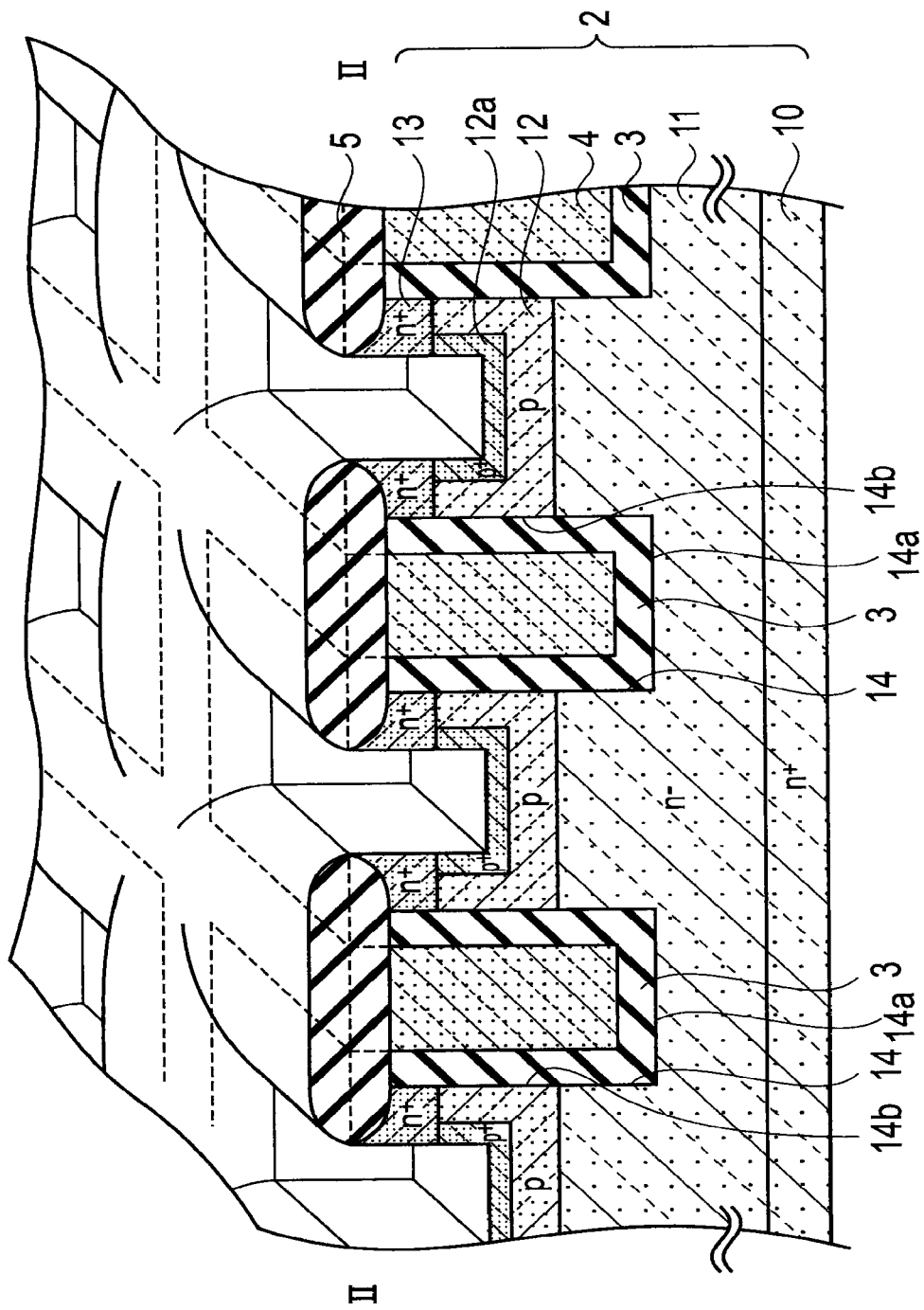
FIG. 5 is a schematic bird's-eye view of the trench type semiconductor device according to the first embodiment of the present invention.

A schematic bird's-eye view of the trench type semiconductor device according to the first embodiment is shown in FIG. 5. FIG. 5 shows a cross-section structure taken in the line II-II of the lattice-like pattern of FIG. 2, and a bird's-eye view structure including its cross-section structure. Since the trench type semiconductor device according to the first embodiment has self-aligned contact structure as clearly from FIG. 5, when it sees from the top surface, the self-aligned contact trench 15 is formed in all regions except interlayer insulating film 5 by the LOCOS oxidation film. Therefore, the source electrode 7 can be formed all over device structure toward the self-aligned contact trench 15.

Hereinafter, the example of material and the size will be explained about each layer of the trench type semiconductor device 1 according to the first embodiment.

The substrate 2 makes the n⁻ type silicon as a main constituent.

The p type second base layer 12 has the thickness of about 0.3 μm, for example. B (boron) is doped in the p type second base layer 12 as the p type impurity. The p type second base layer 12 has the impurity concentration of about $2.0 \times 10^{16}$ atoms/cm³, for example.

The n⁺ type source layer 13 has the thickness of about 0.2 μm, for example. As (arsenic) is doped in the n⁺ type source layer 13 as the n type impurity. The n⁺ type source layer 13 has the impurity concentration of about $1.0 \times 10^{19}$ atoms/cm³, for example.

The trench 14 for dividing the n⁺ type source layer 13 at the predetermined interval is formed in the substrate 2. The trench 14 passes through the p type second base layer 12 and the n⁺ type source layer 13. That is, the trench 14 reaches to the n⁻ type first base layer 11 from the top surface of the substrate 2. The trench 14 has the depth of about 1 μm, for example, and has the width of about 0.25 to 0.5 μm, for example. The pitch intervals between the trench 14 and the trench 14 which are adjoining are about 0.6 μm to about 1.0 μm, for example. The width of the self-aligned contact trench 15 is about 0.2 μm, for example.

The gate insulating film 3 is for insulating between the substrate 2 and the gate electrode 4. The gate insulating film 3 is composed of a silicon dioxide film ($SiO_2$), and has the thickness of about 20 nm to about 100 nm, for example.

The gate electrode 4 is for forming a channel in the p type second base layer 12. The gate electrode 4 is embedded in the trench 14. The gate electrode 4 is composed of polysilicon including an impurity.

The interlayer insulating film 5 is for insulating between the gate electrode 4 and the source electrode 7.

The interlayer insulating film 5 is composed of an insulating material which makes $SiO_2$ as a main constituent. The interlayer insulating film 5 includes As (arsenic) by which ion implantation is performed, as the impurity. In this case, As (arsenic) included in the interlayer insulating film 5 is for increasing the volume capacity of the interlayer insulating film 5. The high impurity concentration of As (arsenic) in the interlayer insulating film 5 is about $1.0 \times 10^{19}$ atoms/cm³ to about $1.0 \times 10^{21}$ atoms/cm³, for example. That is, the high impurity concentration of As (arsenic) in the interlayer insulating film 5 is larger than the high impurity concentration of each layers 11, 12, and 13. The interlayer insulating film 5 has the thickness of about 150 nm, for example. The width of the interlayer insulating film 5 is larger than the width of the trench 14 about 10 nm to about 20 nm.

The source electrode 7 is composed of Al (aluminum) or Al/Cu (copper).

The barrier metal layer 6 is for suppressing that the metallic element, which composes the source electrode 7, is diffused into the substrate 2, etc. The barrier metal layer 6 can apply titanium (Ti), platinum (Pt), nickel (Ni), tungsten (W), or the silicide films of these metals, for example.

The barrier metal layer 6 may pass through the n⁺ type source layer 13 applying the interlayer insulating film 5 as a mask, may be connected to the p type second base layer 12 in the bottom surface 15a of the self-aligned contact trench 15 formed in the p type second base layer 12, and may be connected to the n⁺ type source layer 13 in the sidewall surface 15b of the self-aligned contact trench 15. Furthermore, the barrier metal layer 6 may be formed so that the whole top surface of the interlayer insulating film 5 may be covered.

The n⁺ type drain layer 10 has the thickness of about 0.2 μm, for example. As (arsenic) or P (phosphorus) is doped in the n⁺ type drain layer 10 as the n type impurity. The n⁺ type drain layer 10 has the impurity concentration of about $1.0 \times 10^{19}$ atoms/cm³, for example.

The drain electrode 8 is composed of W (tungsten). The drain electrode 8 is formed on the whole bottom surface of the substrate 2.

The operation of the trench type semiconductor device 1 mentioned above will be explained.

First of all, the predetermined voltage is applied to the gate electrode 4. Accordingly, a channel is formed in the p type second base layer 12 near the interface between the gate insulating film 3 and the p type second base layer 12. In this state, when the voltage is applied between the source electrode 7 and the drain electrode 8, an electron moves in the n⁺ type source layer 13, the channel of the p type second base layer 12, and the n⁻ type first base layer 11, and then reaches to the n⁺ type drain layer 10. As a result, the current flows between the source electrode 7 and the drain electrode 8.

On the other hand, in the case of the IGBT, it operates by the latching-up operational mode same as thyristors, or latching-up operation is not performed and it operates by non latching-up operational mode equivalent to bipolar transistors.

(Fabrication Method)

As shown in FIG. 6 to FIG. 18, a fabrication method of the trench type semiconductor device according to the first embodiment includes: the step of forming the first base layer 11 of the first conductivity type having high resistivity; the step of forming the gate insulating film 3 on the bottom surface 14a and the sidewall surface 14b of the trench 14 formed from the surface of the first base layer 11; the step of forming the gate electrode 4 for filling up into the trench 14 on the gate insulating film 3; the step of covering the gate electrode 4 and forming the interlayer insulating film 5; the step of forming the p type second base layer 12 on the surface of the first base layer 11 formed more shallowly than the bottom surface 14a of the trench 14; the step of forming the n⁺ type source layer 13 on the surface of the second base layer 12; the step of forming the source electrode 7 which passes through the n+ type source layer 13 by applying the interlayer insulating film 5 as the mask, is connected to the p type second base layer 12 in the bottom surface 15a of the self-aligned contact trench 15 formed in the p type second base layer 12, and is connected to the n+ type source layer 13 in the sidewall surface 15b of the self-aligned contact trench 15; the step of forming the n+ type drain layer 10 at the back side of the first base layer 11; and the step of forming the drain electrode 8 at the back side of the n+ type drain layer 10.

The interlayer insulating film 5 is formed with the LOCOS oxidation film, and is formed by covering a part of gate insulating film 3 and a part of source layer 13.

In the step of forming the source electrode 7, the source electrode 7 may be formed all over the device surface.

The step of forming the source electrode 7 may include the step of forming the barrier metal layer 6 in the underlying of the source electrode 7.

As for the first base layer 11 and the second base layer 12, it is preferable for the surface orientation of (100), in each formation step of the first base layer 11 and the second base layer 12.

In the step of forming the trench 14, as for the trench 14, the plane pattern may have rectangular structure, for example.

As for the bottom surface 14a and the sidewall surface 14b of the trench 14, it is preferable for all to have the surface orientation of (100), in the step of forming the trench 14.

As for the bottom surface 15a and the sidewall surface 15b of the self-aligned contact trench 15, it is preferable for all to have the surface orientation of (100) or the surface in parallel to (100), in the step of forming the self-aligned contact trench 15.

In the step of forming the self-aligned contact trench 15, the self-aligned contact trench 15 may have a lattice-like pattern or a zigzagged lattice-like pattern.

Next, the fabrication method of the trench type semiconductor device 1 mentioned above will be explained with reference to drawings. FIG. 6 to FIG. 18 is drawings for explaining the fabrication method of the trench type semiconductor device according to the first embodiment.

Figure 6:
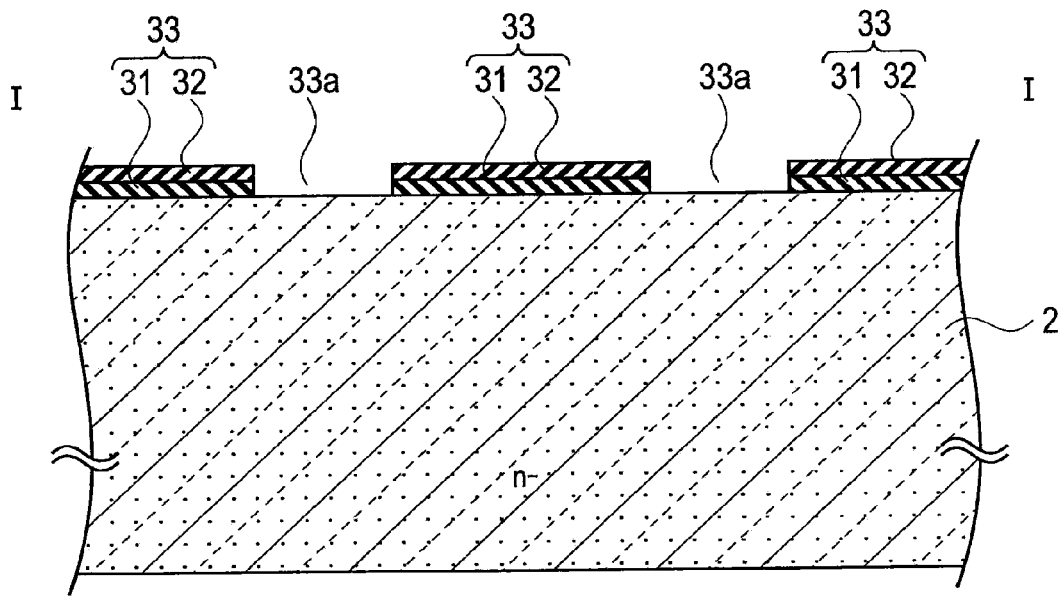
FIG. 6 is a schematic cross-sectional configuration diagram for explaining one process of a fabrication method of the trench type semiconductor device according to the first embodiment of the present invention.

(a) First of all, as shown in FIG. 6, the oxide film ($SiO_2$ film) 31 having the thickness of about 10 nm, for example is formed on the substrate 2. In addition, the thickness of the oxide film 31 can be suitably changed in the range of about 5 nm to about 20 nm, for example. Then, the nitride film (SiN film) 32 having the thickness of about 75 nm, for example is formed on the oxide film 31. In addition, the thickness of the nitride film 32 can be suitably changed in the range of about 50 nm to about 200 nm, for example. Next, a resist film (not shown) is formed on the nitride film 32 by photolithography technology. Then, as shown in FIG. 6, the insulating mask layer 33 in which the apertural area 33a is formed in a part is formed on the substrate 2 by etching a part of the nitride film 32 and a part of the oxide film 31 (mask layer formation process).

Figure 7:
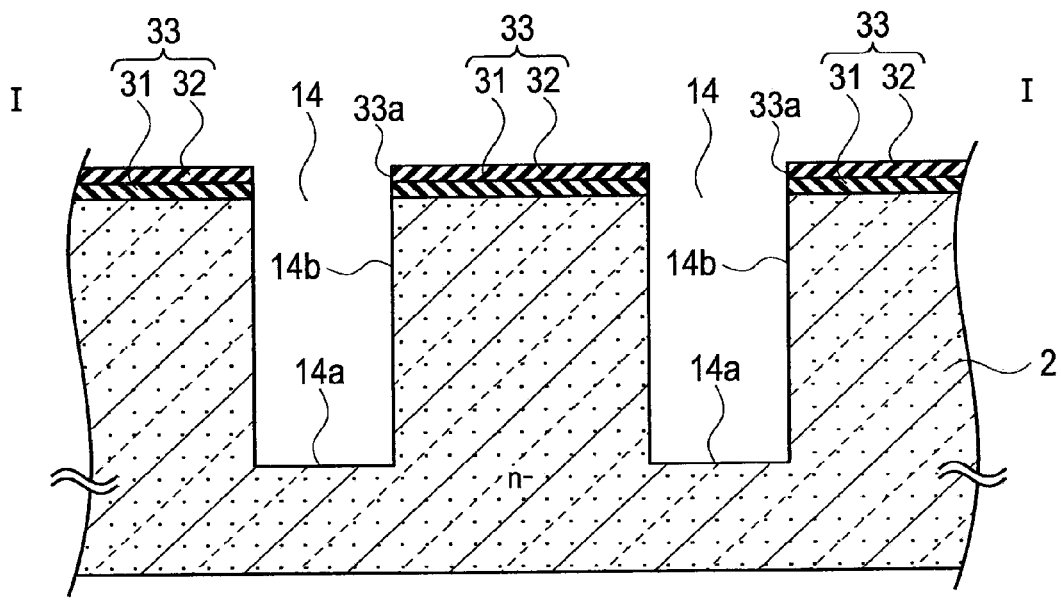
FIG. 7 is a schematic cross-sectional configuration diagram for explaining one process of the fabrication method of the trench type semiconductor device according to the first embodiment of the present invention.

(b) Next, as shown in FIG. 7, the substrate 2 of the region exposed from the mask layer 33 is removed by etching by the RIE (Reactive Ion Etching) method. Accordingly, the trench 14 in which the top edge is opened is formed in the region of the substrate 2 exposed from the mask layer 33 (trench formation process).

Figure 8:
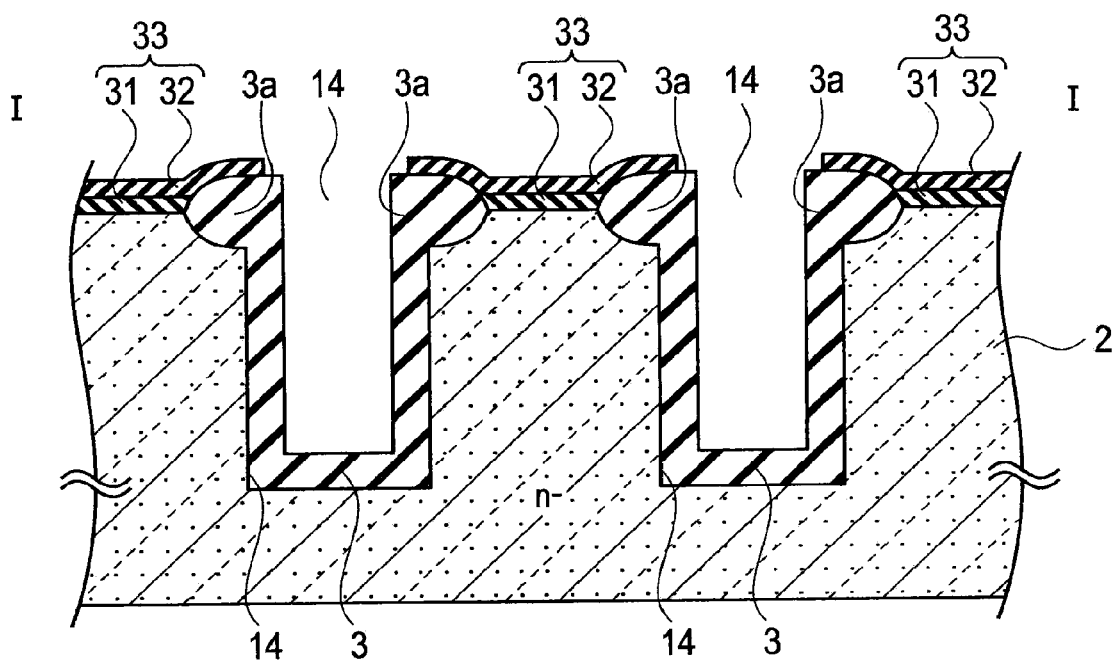
FIG. 8 is a schematic cross-sectional configuration diagram for explaining one process of the fabrication method of the trench type semiconductor device according to the first embodiment of the present invention.

(c) Next, as shown in FIG. 8, the internal wall of the trench 14 is oxidized thermally, and the gate insulating film 3 which is composed of $SiO_2$ is formed. Here, bird's beak-shaped LOCOS oxidation film 3a is formed in the oxide film 31 of the underlying of the nitride film 32 by the thermal oxidation from a horizontal direction.

Figure 9:
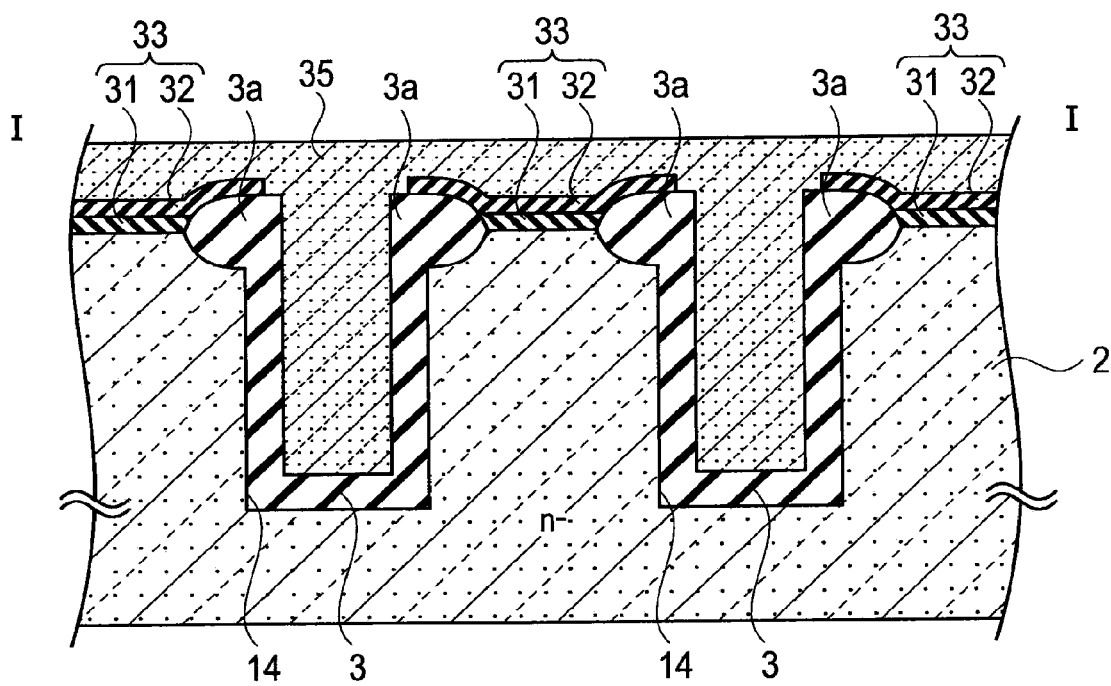
FIG. 9 is a schematic cross-sectional configuration diagram for explaining one process of the fabrication method of the trench type semiconductor device according to the first embodiment of the present invention.

(d) Next, as shown in FIG. 9, the polysilicon layer 35 is formed in the inside of the trench 14 and the top surface of the mask layer 33 by the LPCVD (Low Pressure Chemical Vapor Deposition) method (embedding process).

Figure 10:
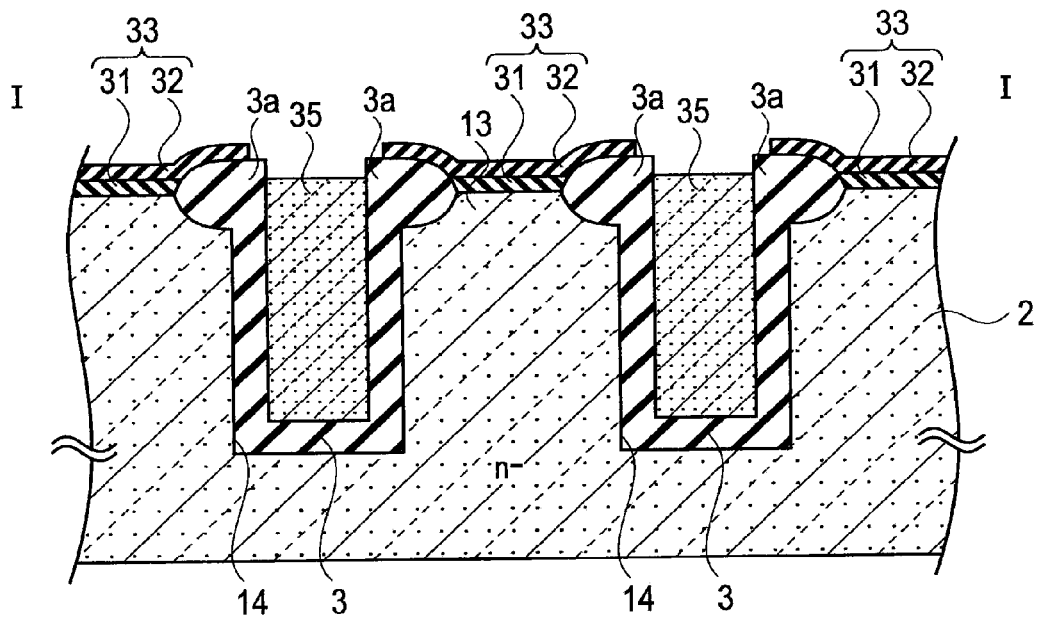
FIG. 10 is a schematic cross-sectional configuration diagram for explaining one process of the fabrication method of the trench type semiconductor device according to the first embodiment of the present invention.

(e) Next, as shown in FIG. 10, the top surface of the polysilicon layer 35 is removed by etching so that the polysilicon layer 35 may remain only in the inside of the trench 14. In this case, the mask layer 33 functions as an etching stopper. Accordingly, the substrate 2 of the lower part of the mask layer 33 is not etched.

Figure 11:
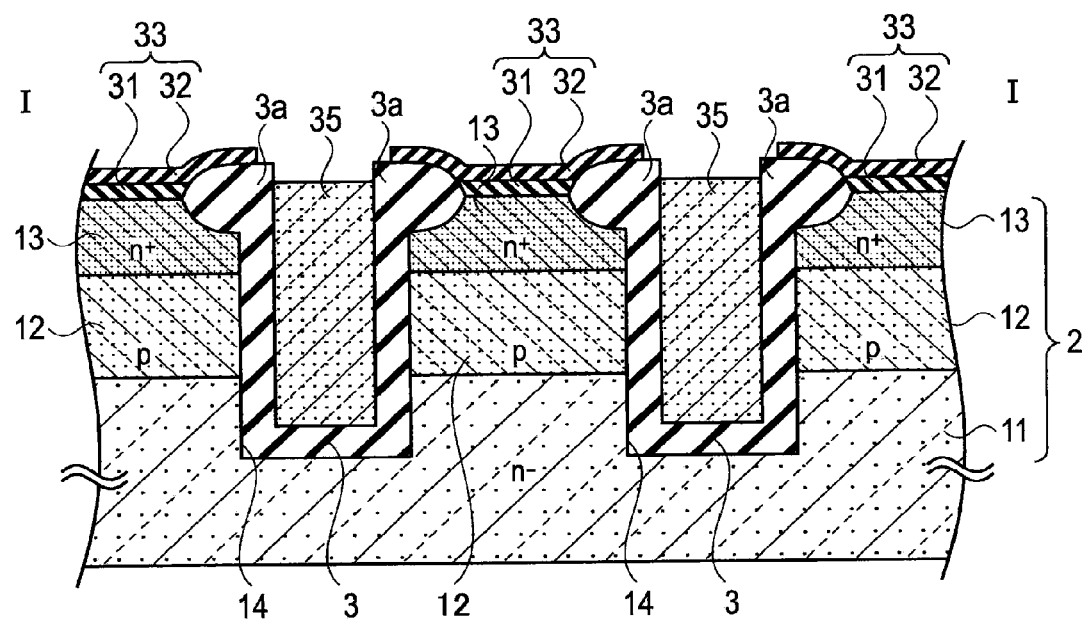
FIG. 11 is a schematic cross-sectional configuration diagram for explaining one process of the fabrication method of the trench type semiconductor device according to the first embodiment of the present invention.

(f) Next, B (boron) which is accelerated on the energy voltage of about 40 keV to about 180 keV, for example, and whose amount of dosage of about $1.0 \times 10^{12}$ atoms/cm² to about $1.0 \times 10^{14}$ atoms/cm², for example is ion-implanted from the top surface of the substrate 2. Then, B (boron) is diffused by annealing the substrate 2, and as shown in FIG. 11, the p type second base layer 12 is formed.

(g) Next, for example, the As (arsenic) which is accelerated on the energy voltage of about 40 keV to about 180 keV, for example, and whose amount of dosage of about $1.0 \times 10^{14}$ atoms/cm² to about $1.0 \times 10^{16}$ atoms/cm² is ion-implanted from the top surface of the substrate 2. Then, as shown in FIG. 11, As (arsenic) is diffused by annealing the substrate 2 and the n+ type source layer 13 is formed (second ion implantation process). In this case, B (boron) and As (arsenic) are implanted with the accelerating energy voltage which can pass through the mask layer 33.

Figure 12:
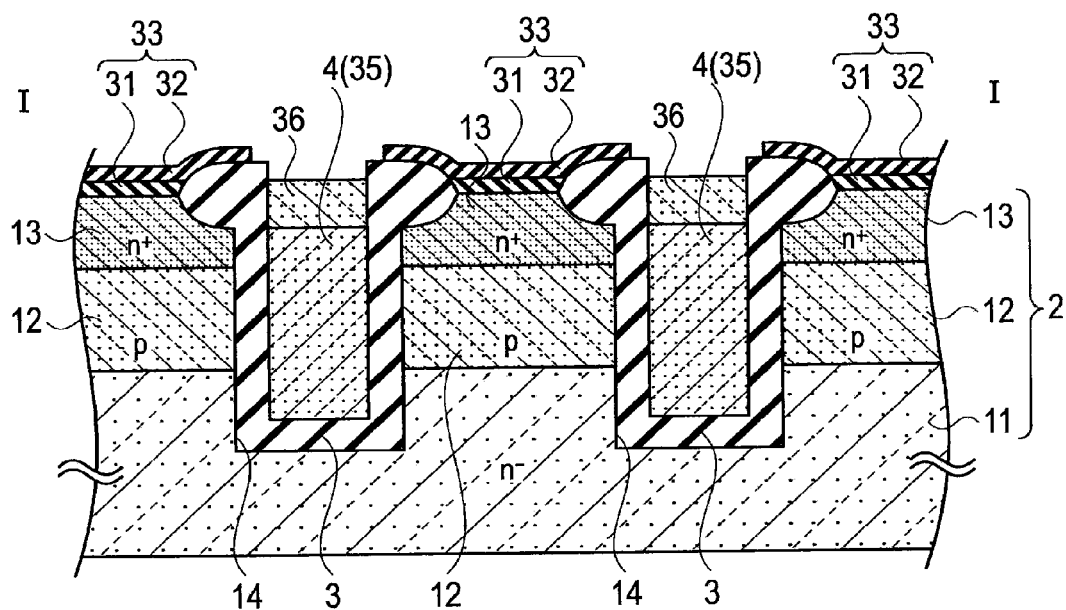
FIG. 12 is a schematic cross-sectional configuration diagram for explaining one process of the fabrication method of the trench type semiconductor device according to the first embodiment of the present invention.

(h) Next, as shown in FIG. 12, As (arsenic) ion different from Si (silicon) which composes the polysilicon layer 35 is implanted into the top surface of the polysilicon layer 35 embedded in the trench 14. In this case, As (arsenic) is implanted with the amount of dosage of about $5 \times 10^{15}$ atoms/cm² to about $5 \times 10^{16}$ atoms/cm², for example, and is implanted with the accelerating energy voltage of about 5 keV to about 40 keV, for example. Accordingly, the top edge of the polysilicon layer 35 is made amorphous. As a result, the ion implantation layer 36 is formed on the upper part of the polysilicon layer 35. In addition, since the accelerating energy voltage of As (arsenic) in this process is small, As (arsenic) is intercepted by the mask layer 33. Accordingly, As (arsenic) is hardly implanted into the n+ type source layer 13 of the substrate 2. Moreover, the polysilicon layer 35 of the region where As (arsenic) ion is not implanted becomes the gate electrode 4 (first ion implantation process). In this case, the high impurity concentration of As (arsenic) of the ion implantation layer 36 ion-implanted in the first ion implantation process is larger than the high impurity concentration of the regions 12 and 13 ion-implanted in the second ion implantation process.

Figure 13:
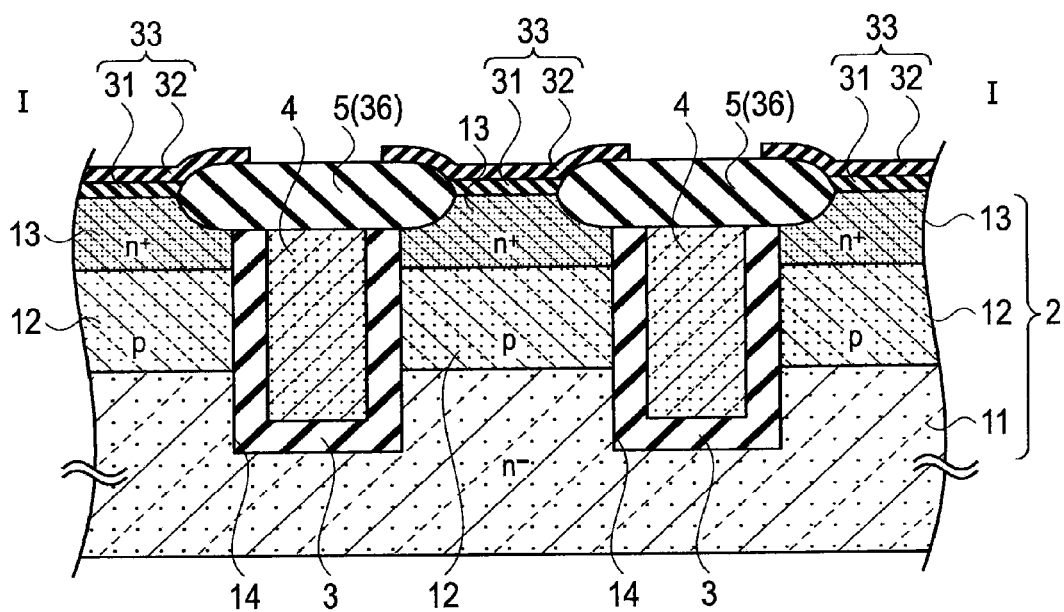
FIG. 13 is a schematic cross-sectional configuration diagram for explaining one process of the fabrication method of the trench type semiconductor device according to the first embodiment of the present invention.

(i) Next, the substrate 2 is heated at about 900 degrees C. for about 30 minutes. Accordingly, as shown in FIG. 13, the ion implantation layer 36 into which As (arsenic) ion is implanted is oxidized thermally, and the volume capacity of the ion implantation layer 36 is increased.

As a result, the interlayer insulating film (LOCOS insulating film) 5 having the thickness of about 300 nm, for example is formed on the upper part of the gate electrode 4 so that the aperture of the trench 14 may be filled up (interlayer insulating film formation process). In this case, the interlayer insulating film 5 may be formed by general LOCOS process. When doing in this way, it is necessary to anneal the substrate at about 1100 degrees C. for about 60 minutes. In the fabrication method according to the first embodiment mentioned above, the interlayer insulating film 5 can be formed in low temperature and a short time compared with the general LOCOS process.

Figure 14:
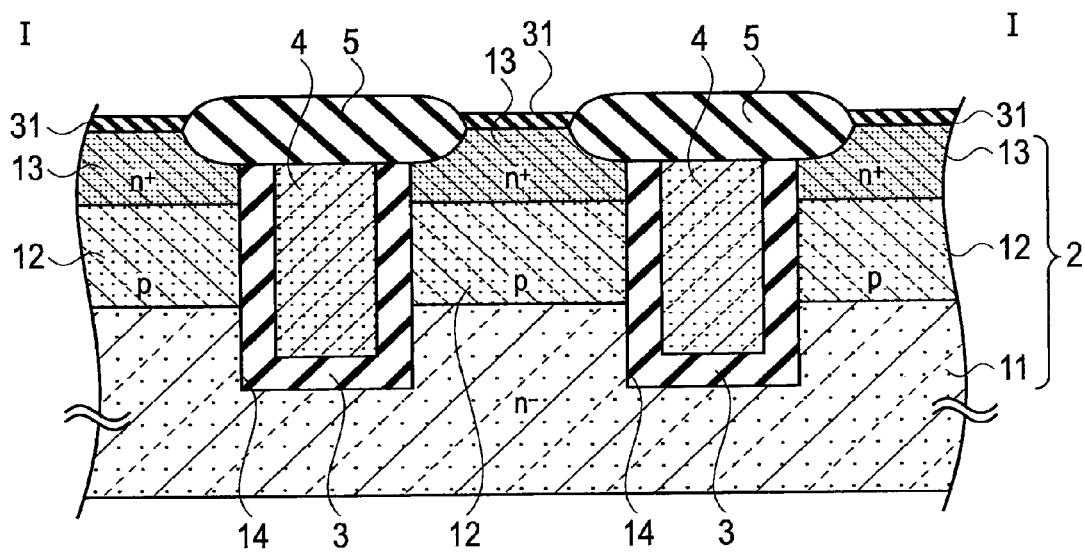
FIG. 14 is a schematic cross-sectional configuration diagram for explaining one process of the fabrication method of the trench type semiconductor device according to the first embodiment of the present invention.

(j) Next, as shown in FIG. 14, the nitride film 32 of the mask layer 33 is removed by etching.

Figure 15:
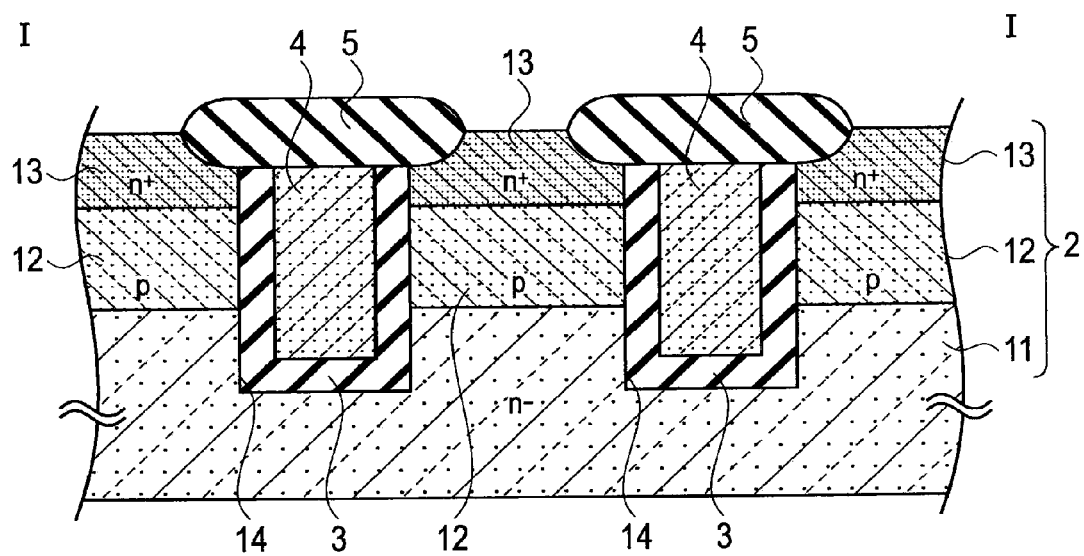
FIG. 15 is a schematic cross-sectional configuration diagram for explaining one process of the fabrication method of the trench type semiconductor device according to the first embodiment of the present invention.

(k) Next, as shown in FIG. 15, the oxide film 31 is removed by etching. Here, a part of interlayer insulating film 5, which make a silicon dioxide film ($SiO_2$ film) as a main constituent, is removed by the etching process. However, the thickness of the interlayer insulating film 5 is extremely large compared with the thickness of the oxide film 31. Accordingly, if it sees from the whole interlayer insulating film 5, the removed interlayer insulating film 5 is very small, and is not a problem.

Figure 16:
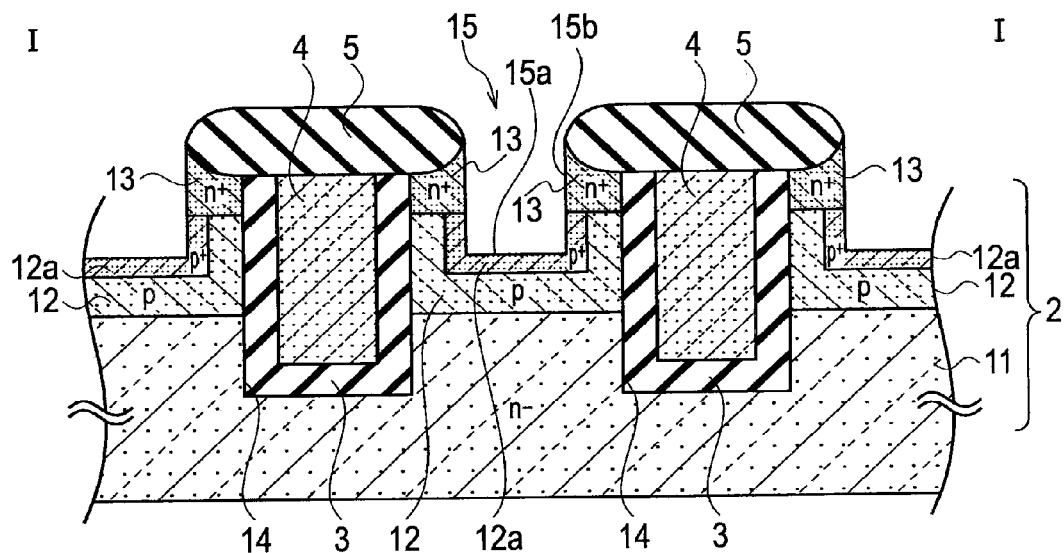
FIG. 16 is a schematic cross-sectional configuration diagram for explaining one process of the fabrication method of the trench type semiconductor device according to the first embodiment of the present invention.

(l) Next, as shown in FIG. 16, the self-aligned contact trench 15 is formed in self-alignment, using the interlayer insulating film 5 as a mask. The depth of the self-aligned contact trench 15 passes through the $n^+$ type source layer 13, as shown in FIG. 16, and the bottom surface 15a of the self-aligned contact trench 15 reaches in the p type second base layer 12. In formation of the above-mentioned self-aligned contact trench 15, the RIE method same as the dry etching technology of the silicon in which the trench 14 is formed is applicable (self-aligned contact trench formation process).

Figure 17:
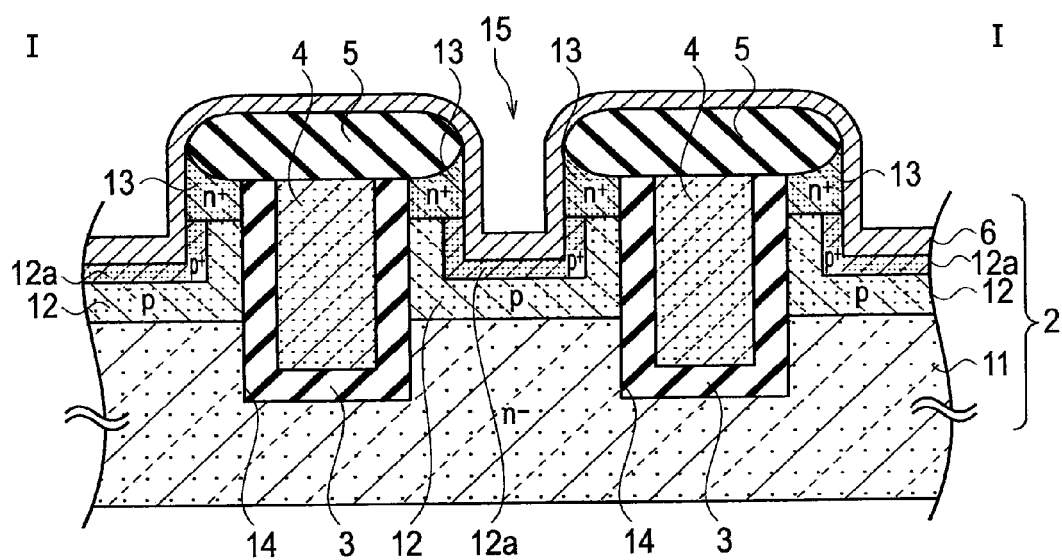
FIG. 17 is a schematic cross-sectional configuration diagram for explaining one process of the fabrication method of the trench type semiconductor device according to the first embodiment of the present invention.

(m) Next, as shown in FIG. 17, the barrier metal layer 6 is formed so that the whole device surface may be covered. In this case, the barrier metal layer 6 is connected to the second base layer 12 in the bottom surface 15a of the self-aligned contact trench 15, and is connected to the source layer 13 in the sidewall surface 15b of the self-aligned contact trench 15.

Figure 18:
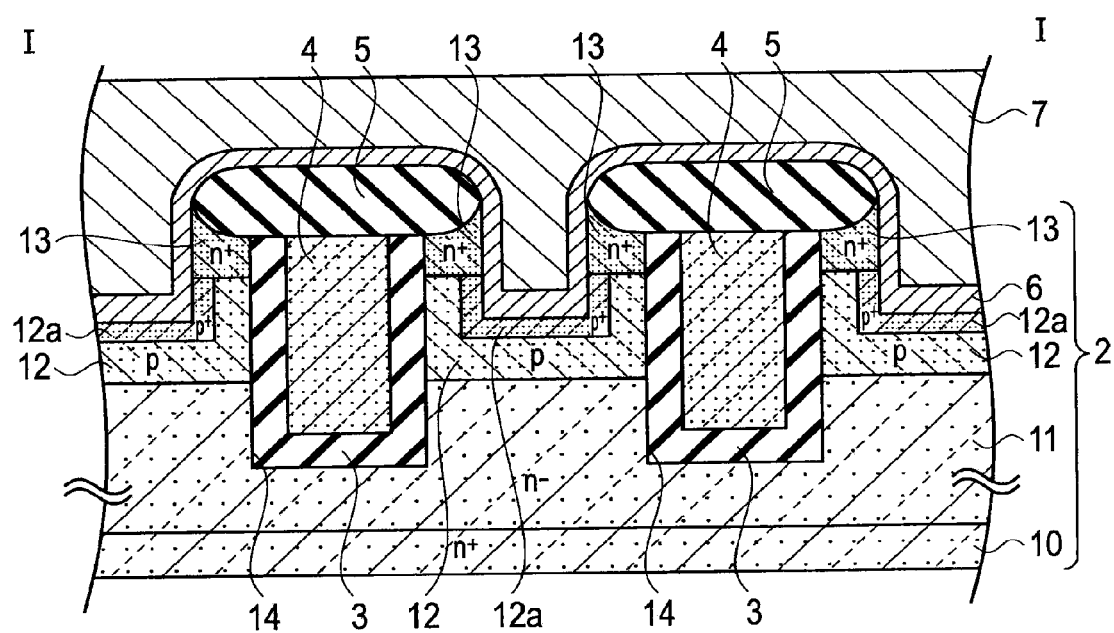
FIG. 18 is a schematic cross-sectional configuration diagram for explaining one process of the fabrication method of the trench type semiconductor device according to the first embodiment of the present invention.

(n) Next, as shown in FIG. 18, the source electrode 7 is formed so that the whole device surface may be covered.

(o) Next, the back side of the substrate 2 is polished by the CMP (Chemical Mechanical Polishing) technology, and after thin-layering the substrate 2, the $n^+$ type drain layer 10 is formed on the back side of the first base layer 11 by using diffusion or ion implantation technology. The reason for thin-layering the substrate 2 is for shortening the transit distance of the electron between the source layer 13 and the drain layer 10, and achieving improvement in the speed, securing a predetermined breakdown voltage.

(o) Finally the drain electrode 8 is formed on the bottom surface of the substrate 2. Accordingly, the trench type semiconductor device 1 shown in FIG. 1 is completed.

As mentioned above, the trench type semiconductor device 1 according to the first embodiment is performing the ion implantation of As (arsenic), which is different from Si (silicon) which is a semiconductor material composing the interlayer insulating film 5, to the interlayer insulating film 5. Furthermore, in the trench type semiconductor device 1, the impurity concentration of the interlayer insulating film 5 is made larger than the impurity concentration of the regions 12 and 13. Accordingly, in the process of annealing the ion implantation layer 36 and forming the interlayer insulating film 5, since a lot of As (arsenic) atoms are trapped in between Si (silicon) atoms in the ion implantation layer 36, the amplification factor of the volume capacity of the interlayer insulating film 5 can be improved. Accordingly, the insulation by the interlayer insulating film 5 can be improved, and the short-circuit between the source electrode 7 and the gate electrode 4 can be suppressed. Moreover, the interlayer insulating film 5 can be formed by the oxidation and volume expansion by annealing process of low temperature and a short time compared with the forming temperature and forming time by the general LOCOS. Accordingly, it can suppress that the impurity atoms are diffused into each layers 11 and 12 and 13 by annealing for forming the interlayer insulating film 5. As a result, degradation of the element characteristic of the trench type semiconductor device 1 can be suppressed.

In the first embodiment, the interlayer insulating film 5 between electrodes is formed by the self-alignment by the LOCOS, and it is further possible of formation of the contact hole minute in self-align between the trench—trench by applying its LOCOS oxidation film as a mask.

According to the first embodiment, the interlayer insulating film 5 includes the semiconductor material and the impurity consisting of the element different from its semiconductor material, and the impurity concentration of the interlayer insulating film 5 is made larger than the impurity concentration of the semiconductor region formed in the substrate. Accordingly, the volume capacity of the interlayer insulating film 5 is increased easily, and the interlayer insulating film 5 can be formed thickly.

According to the first embodiment, the self-aligned contact trench 15 deeper than the diffusing depth of the source layer 13 is formed in the region which formed the electric contact conventionally by applying the interlayer insulating film 5 of the upper part of the trench 14 as a mask. According, it is making the source contact by the sidewall surface 15b of the self-aligned contact trench 15, and is making the body electric contact on the bottom surface 15a of the self-aligned contact trench 15. According to the self-aligned contact structure, the contact area can be increased more substantial than the conventional structure, the contact resistance can be reduced, and the reduction of on resistance can be achieved.

According to the first embodiment, since the contact area increases by the structure of the self-aligned contact trench 15, the contact resistance of the source contact unit which is a current path decreases, and the on resistance at the time of MOSFET conduction can be reduced.

Furthermore, according to the first embodiment, since it is securely connectable by the self-alignment in the bottom of the self-alignment contact hole, also about the connection method and the contact area of the body electric contact which were the problems of the miniaturization, the miniaturization to the limit of the lithography process is possible, and the improvement in the breakdown capability toward the avalanche breakdown, BD (BodyDiode) breakdown, etc. can also be achieved.

After forming the LOCOS interlayer film and removing the SiN film, the silicon etching of the whole surface is performed more deeply than the junction depth of the source layer 13. By the process, the silicon etching region is determined in self-alignment, and the miniaturization becomes possible.

Moreover, the mask layer 33 functions as a mask of the process of forming the trench 14, and functions as a mask of the process of forming the interlayer insulating film 5. That is, the trench 14 and the interlayer insulating film 5 can be formed by self-alignment. Accordingly, since it can suppress that the relative position between the trench 14 and the interlayer insulating film 5 shifts, the interlayer insulating film 5 can be formed in a position with the exact top edge of the trench 14.

Furthermore, the self-aligned contact trench 15 can be formed in self-alignment by using the interlayer insulating film 5 formed in self-alignment, the contact area can be increased, the contact resistance can be reduced, and the reduction of on resistance can be achieved.

According to the first embodiment, in the MOSFET, the IGBT, etc. having the trench type gate structure, the interlayer film between the electrodes needed for the trench upper part is formed by self-alignment by the LOCOS, and the silicon trench is formed between the trench—trench by applying the LOCOS oxidation film as a mask, and then the metal layer is formed in the recessed trench. Accordingly, the contact hole can be formed in self-alignment. According to the self-aligned contact, since it becomes possible to take the electric contact to a lengthwise direction, it can improve also about the contact area which was a problem of the miniaturization, and the reduction of on resistance and the improvement in breakdown capability can be achieved.

According to the first embodiment, the trench type semiconductor device which achieves the minute structure by the fully self-aligned, and reduces the on resistance and improves the breakdown capability, and the fabrication method for the trench type semiconductor device can be provided.

Second Embodiment

Figure 19:
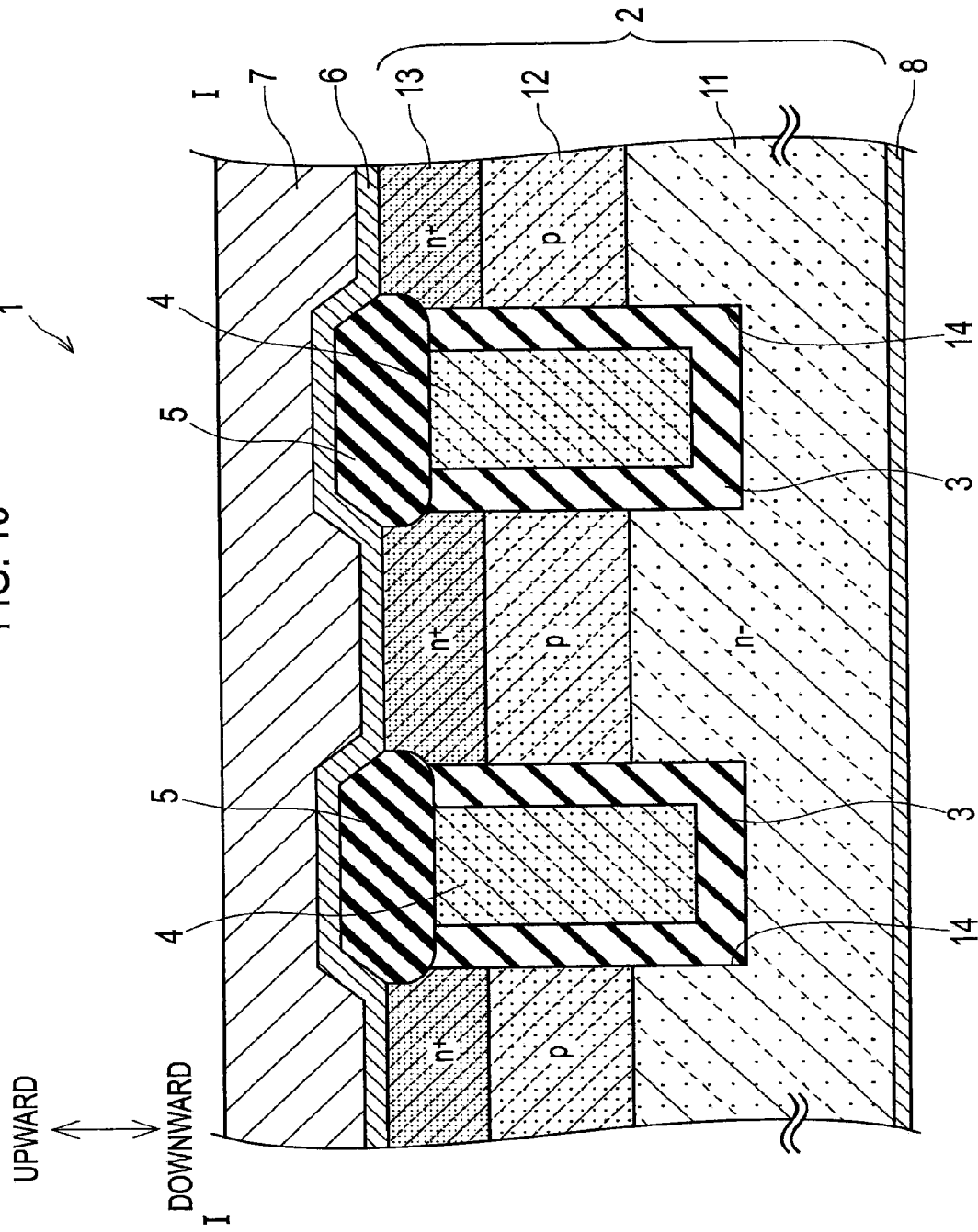
FIG. 19 is a schematic cross-sectional configuration diagram of a trench type semiconductor device according to a second embodiment of the present invention.

Hereinafter, a second embodiment which applies the present invention to the MOSFET with reference to drawings will be described. FIG. 19 is a schematic cross-sectional configuration diagram of a trench type semiconductor device 1 according to the second embodiment. In addition, upward and downward shown by the arrow of FIG. 19 is applied as the up-and-down direction of the trench type semiconductor device 1.

As shown in FIG. 19, the trench type semiconductor device 1 according to the second embodiment includes a substrate 2, a gate insulating film 3, a gate electrode 4, an interlayer insulating film 5, a barrier metal layer 6, a source electrode 7, and a drain electrode 8.

The substrate 2 makes n$^-$ type silicon as a main constituent.

A n$^-$ type first base layer 11 is formed in the drain electrode 8 side of the substrate 2.

A p$^-$ type second base layer 12 is formed in the intermediate layer of the substrate 2. The p$^-$ type second base layer 12 has the thickness of about 0.3 μm. B (boron) is doped as the p type impurity in the p$^-$ type second base layer 12. The p$^-$ type second base layer 12 has the high impurity concentration of about $2.0 \times 10^{16}$ atoms/cm$^3$.

A n$^+$ type source layer 13 is formed in the upper layer of the substrate 2. The n$^+$ type source layer 13 has the thickness of about 0.2 μm. As (arsenic) is doped as the n type impurity in the n$^+$ type source layer 13. The n$^+$ type source layer 13 has the high impurity concentration of about $1.0 \times 10^{19}$ atoms/cm$^3$.

A trench 14 for dividing the n$^+$ type source layer 13 at the predetermined interval is formed in the substrate 2. The trench 14 passes through the p$^-$ type second base layer 12 and the n$^+$ type source layer 13. That is, the trench 14 reaches to the n$^-$ type first base layer 11 from the top surface of the substrate 2. The trench 14 has the depth of about 1 μm. The trench 14 has the width of about 0.5 μm. The interval between the trench 14 and the trench 14 which are adjoining is about 0.2 μm.

The gate insulating film 3 is for insulating between the substrate 2 and the gate electrode 4. The gate insulating film 3 is formed so that the inner peripheral surface of the trench 14 may be covered. The gate insulating film 3 is composed of SiO$_2$. The gate insulating film 3 has the thickness of about 55 nm.

The gate electrode 4 is for forming a channel in the p$^-$ type second base layer 12. The gate electrode 4 is embedded in the trench 14. The gate electrode 4 is composed of polysilicon including impurity atoms.

The interlayer insulating film 5 is for insulating between the gate electrode 4 and the source electrode 7. The interlayer insulating film 5 is composed of an insulating material which makes SiO$_2$ as a main constituent. The interlayer insulating film 5 includes As (arsenic) by which ion implantation is performed, as the impurity. In this case, As (arsenic) included in the interlayer insulating film 5 is for increasing the volume capacity of the interlayer insulating film 5. The high impurity concentration of As (arsenic) in the interlayer insulating film 5 is about $1.0 \times 10^{19}$ atoms/cm$^3$ to about $1.0 \times 10^{21}$ atoms/cm$^3$. That is, the high impurity concentration of As (arsenic) in the interlayer insulating film 5 is larger than the high impurity concentration of each region 11, 12, and 13. The interlayer insulating film 5 has the thickness of about 150 nm. The width of the interlayer insulating film 5 is larger than the width of the trench 14 about 10 nm to about 20 nm. However, when it takes into consideration that the width of the trench 14 is about 0.5 μm, the width of the interlayer insulating film 5 and the width of the trench 14 are ranges consider that are substantially the same.

The barrier metal layer 6 is for suppressing that the metallic element, which composes the source electrode 7, is diffused into the substrate 2, etc. The barrier metal layer 6 is composed of titanium silicide. The barrier metal layer 6 is formed so that the whole top surface of the n$^+$ type source layer 13 and the interlayer insulating film 5 may be covered.

The source electrode 7 is composed of Al (aluminum) or Al/Cu (copper). The source electrode 7 is formed so that the whole top surface of the barrier metal layer 6 may be covered.

The drain electrode 8 is composed of W (tungsten). The drain electrode 8 is formed on the whole bottom surface of the substrate 2.

The operation of the trench type semiconductor device 1 mentioned above will be explained.

First of all, the predetermined voltage is applied to the gate electrode 4. Accordingly, a channel is formed in the p$^-$ type second base layer 12 near the interface between the gate insulating film 3 and the p$^-$ type second base layer 12. In this state, when the voltage is applied between the source electrode 7 and the drain electrode 8, an electron moves in the n$^+$ type source layer 13, the channel of the p$^-$ type second base layer 12, and the n$^-$ type first base layer 11. As a result, the current flows between the source electrode 7 and the drain electrode 8.

(Fabrication Method)

Next, the fabrication method of the trench type semiconductor device 1 mentioned above will be explained with reference to drawings. FIG. 20 to FIG. 30 are schematic cross-sectional configuration diagrams for explaining one process of the fabrication method of the trench type semiconductor device according to the second embodiment of the present invention.

Figure 20:
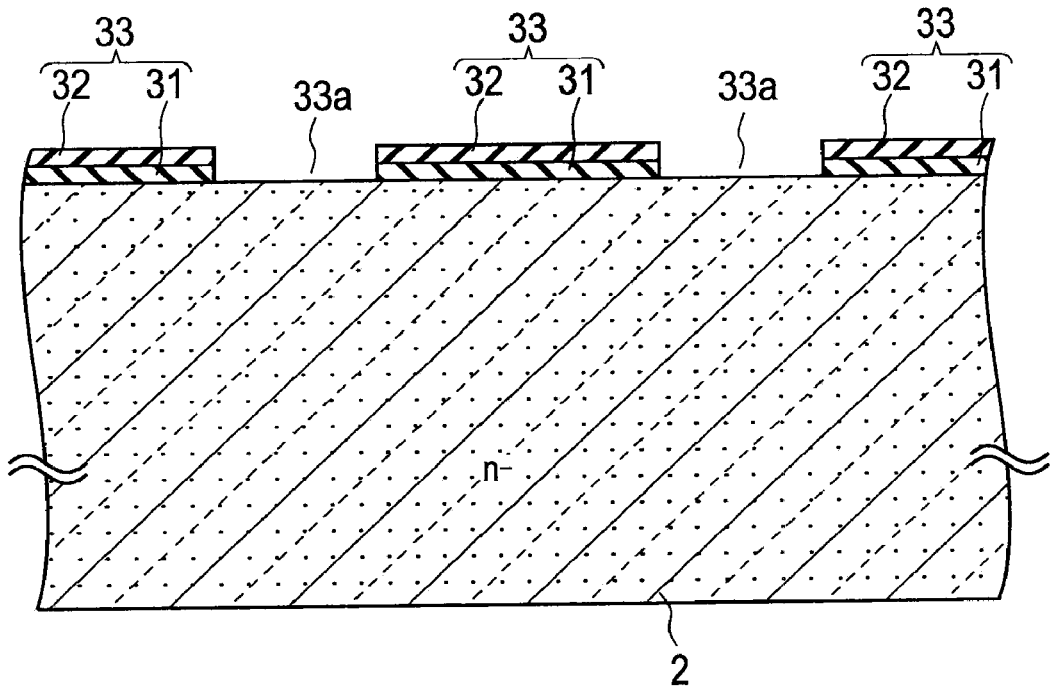
FIG. 20 is a schematic cross-sectional configuration diagram for explaining one process of a fabrication method of the trench type semiconductor device according to the second embodiment of the present invention.

(a) First of all, the oxide film 31 having the thickness of about 10 nm is formed on the substrate 2. In addition, the thickness of the oxide film 31 can be suitably changed in the range of about 5 nm to about 20 nm. Then, the nitride film 32 having the thickness of 75 nm is formed on the oxide film 31. In addition, the thickness of the nitride film 32 can be suitably changed in the range of about 50 nm to about 200 nm. Next, a resist film (not shown) is formed on the nitride film 32 by photolithography technology. Then, as shown in FIG. 20, the insulating mask layer 33 in which the apertural area 33a is formed in a part is formed on the substrate 2 by etching a part of the nitride film 32 and a part of the oxide film 31 (mask layer formation process).

Figure 21:
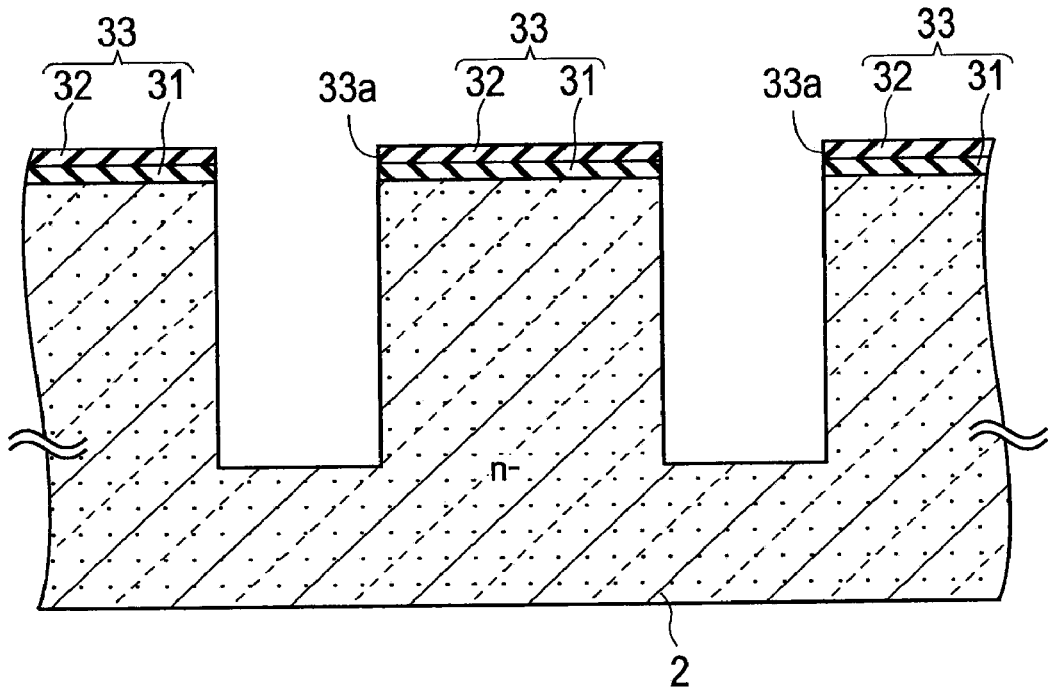
FIG. 21 is a schematic cross-sectional configuration diagram for explaining one process of the fabrication method of the trench type semiconductor device according to the second embodiment of the present invention.

(b) Next, as shown in FIG. 21, the substrate 2 of the region exposed from the mask layer 33 is removed by the RIE (reactive ion etching) method. Accordingly, the trench 14 in which the top edge is opened is formed in the region of the substrate 2 exposed from the mask layer 33 (trench formation process).

Figure 22:
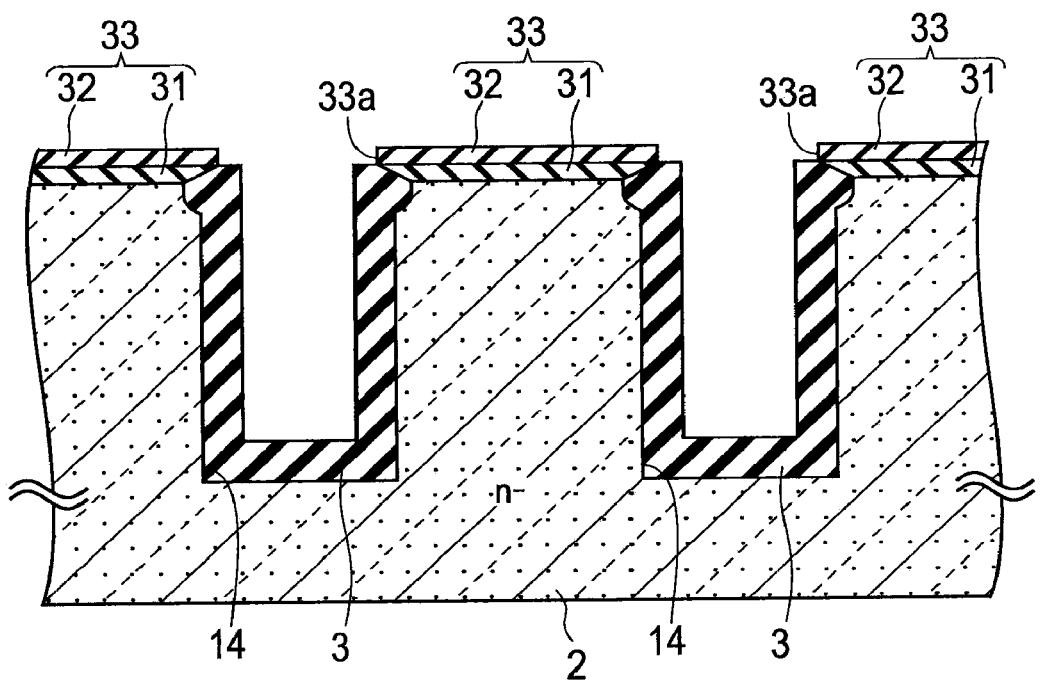
FIG. 22 is a schematic cross-sectional configuration diagram for explaining one process of the fabrication method of the trench type semiconductor device according to the second embodiment of the present invention.

(c) Next, the substrate 2 is annealed. Accordingly, as shown in FIG. 22, the internal wall of the trench 14 is oxidized thermally and then the gate insulating film 3 composed of SiO$_2$ is formed.

Figure 23:
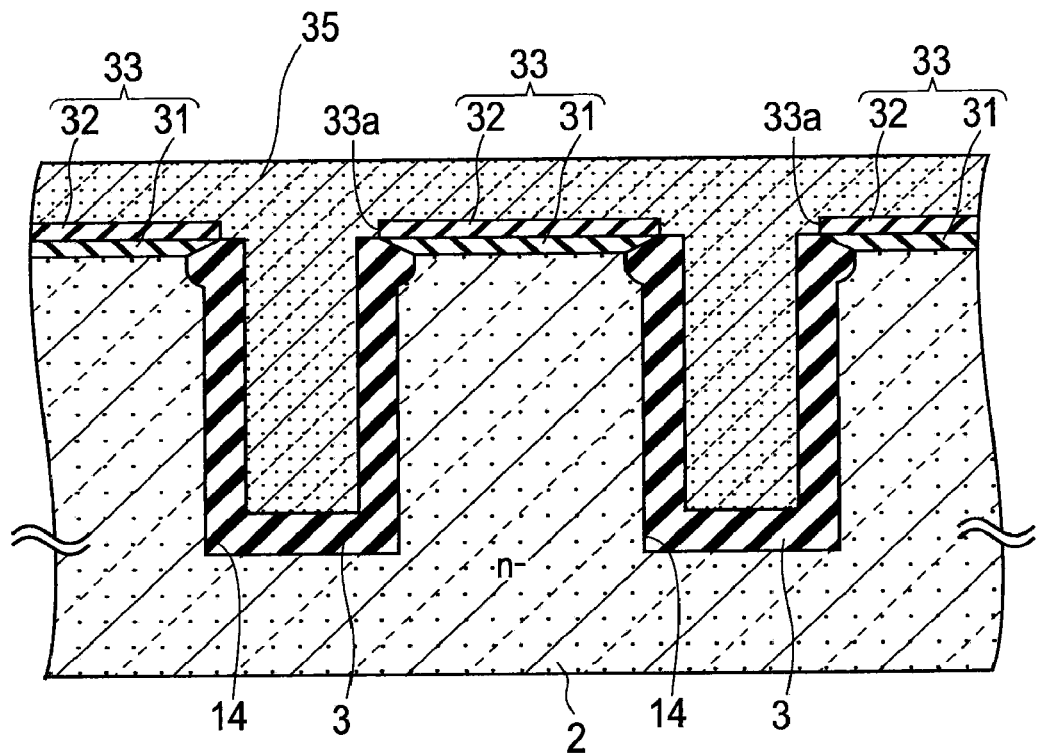
FIG. 23 is a schematic cross-sectional configuration diagram for explaining one process of the fabrication method of the trench type semiconductor device according to the second embodiment of the present invention.

(d) Next, as shown in FIG. 23, the polysilicon layer 35 is formed in the inside of the trench 14 and the top surface of the mask layer 33 by the LPCVD method (embedding process). In addition, the polysilicon layer 35 is equivalent to a semiconductor layer described in scope of claims.

Figure 24:
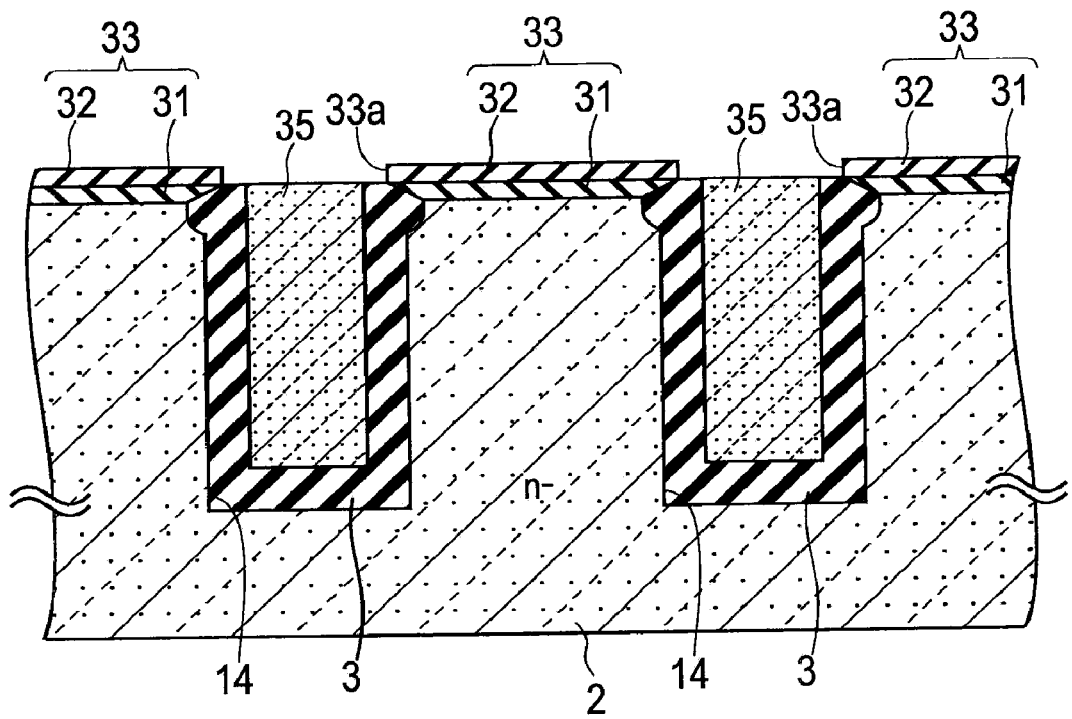
FIG. 24 is a schematic cross-sectional configuration diagram for explaining one process of the fabrication method of the trench type semiconductor device according to the second embodiment of the present invention.

(e) Next, as shown in FIG. 24, the top surface of the polysilicon layer 35 is removed by etching so that the polysilicon layer 35 may remain only in the inside of the trench 14. In this case, the mask layer 33 functions as an etching stopper. Accordingly, the substrate 2 of the lower part of the mask layer 33 is not etched.

(f) Next, B (boron) which is accelerated on the energy voltage of about 40 keV to about 180 keV, and whose amount of dosage of about $1.0 \times 10^{12}$ atoms/cm$^2$ to about $1.0 \times 10^{14}$ atoms/cm$^2$ is ion-implanted from the top surface of the substrate 2. Then, B (boron) is diffused by annealing the substrate 2, and as shown in FIG. 25, the p$^-$ type second base layer 12 is formed.

(g) Next, As (arsenic) which is accelerated on the energy voltage of about 40 keV to about 180 keV, and whose amount of dosage of about $1.0 \times 10^{14}$ atoms/cm$^2$ to about $1.0 \times 10^{16}$ atoms/cm$^2$ is ion-implanted from the top surface of the substrate 2.

Figure 25:
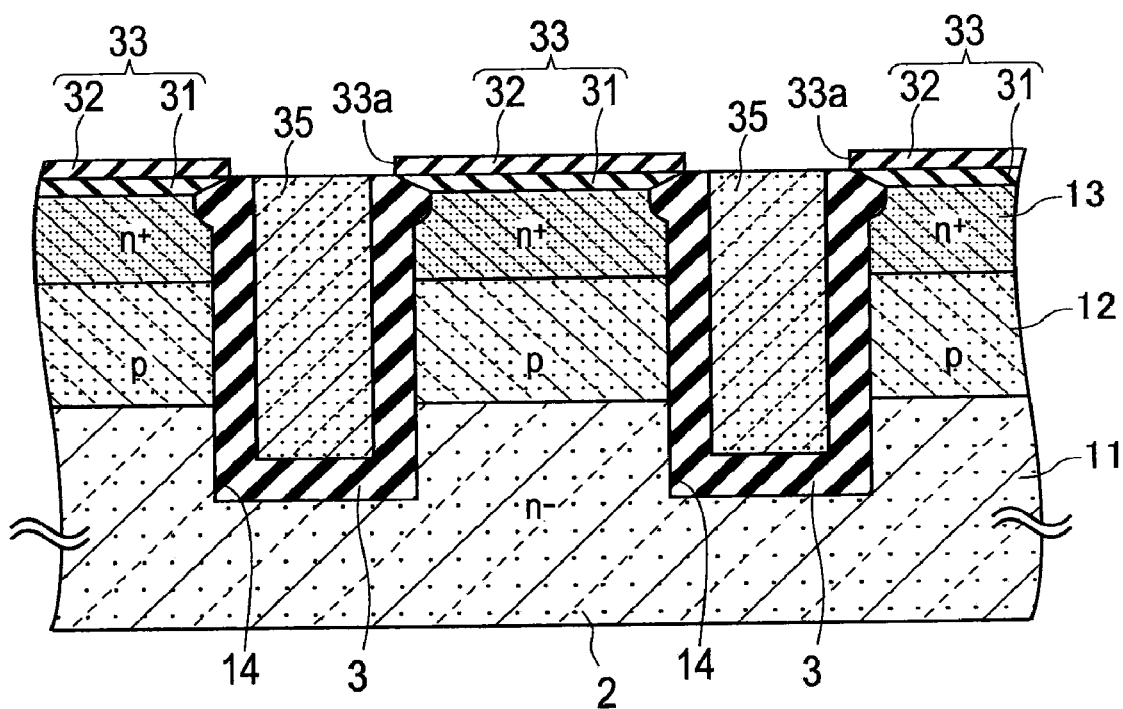
FIG. 25 is a schematic cross-sectional configuration diagram for explaining one process of the fabrication method of the trench type semiconductor device according to the second embodiment of the present invention.

(h) Then, as shown in FIG. 25, As (arsenic) is diffused by annealing the substrate 2 and then the n$^+$ type source layer 13 is formed (second ion implantation process). In this case, B (boron) and As (arsenic) are implanted with the accelerating energy voltage which can pass through the mask layer 33.

Figure 26:
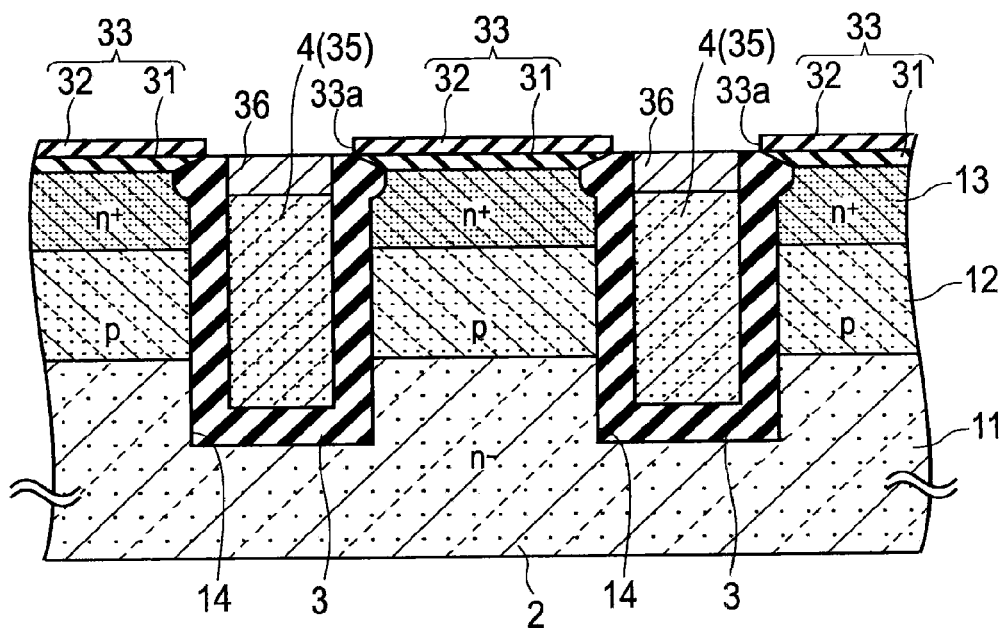
FIG. 26 is a schematic cross-sectional configuration diagram for explaining one process of the fabrication method of the trench type semiconductor device according to the second embodiment of the present invention.

(i) Next, as shown in FIG. 26, As (arsenic) ion different from Si (silicon) which composes the polysilicon layer 35 is implanted into the top surface of the polysilicon layer 35 embedded in the trench 14. In this case, As (arsenic) is implanted with the amount of dosage of about $5 \times 10^{15}$ atoms/cm$^2$ to about $5 \times 10^{16}$ atoms/cm$^2$, and is implanted with the accelerating energy voltage of about 5 keV to about 40 keV. Accordingly, the top edge of the polysilicon layer 35 is made amorphous. As a result, the ion implantation layer 36 is formed on the upper part of the polysilicon layer 35. In addition, since the accelerating energy voltage of As (arsenic) in the process is small, As (arsenic) is intercepted by the mask layer 33. Accordingly, As (arsenic) is hardly implanted into the n$^+$ type source layer 13 of the substrate 2. Moreover, the polysilicon layer 35 of the region where As (arsenic) ion is not implanted becomes the gate electrode 4 (first ion implantation process). In this case, the high impurity concentration of As (arsenic) of the ion implantation layer 36 ion-implanted in the first ion implantation process is larger than the high impurity concentration of the regions 12 and 13 ion-implanted in the second ion implantation process.

Figure 27:
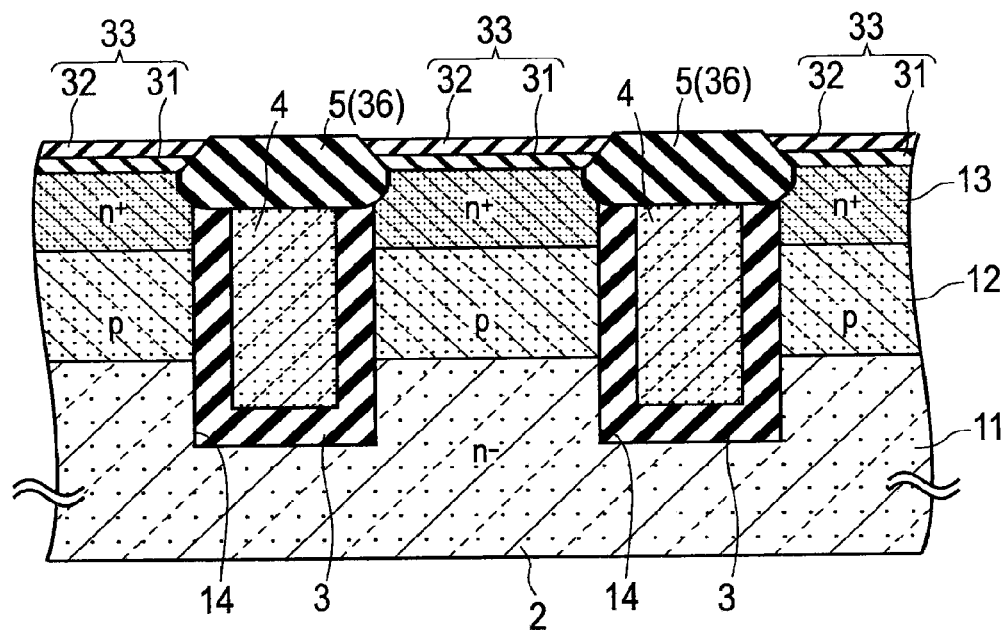
FIG. 27 is a schematic cross-sectional configuration diagram for explaining one process of the fabrication method of the trench type semiconductor device according to the second embodiment of the present invention.

(j) Next, the substrate 2 is annealed at about 900 degrees C for about 30 minutes. Accordingly, as shown in FIG. 27, the ion implantation layer 36 into which As (arsenic) ion is implanted is oxidized thermally, and the volume capacity of the ion implantation layer 36 is amplified. As a result, the interlayer insulating film 5 having the thickness of about 300 nm is formed on the upper part of the gate electrode 4 so that the aperture of the trench 14 may be filled up (interlayer insulating film formation process). Here, when forming the interlayer insulating film by the LOCOS process, it is necessary to anneal the substrate for about 60 minutes at about 1100 degrees C. In the fabrication method according to the second embodiment mentioned above, it proves that the interlayer insulating film 5 is formed in low temperature and a short time compared with the LOCOS process.

Figure 28:
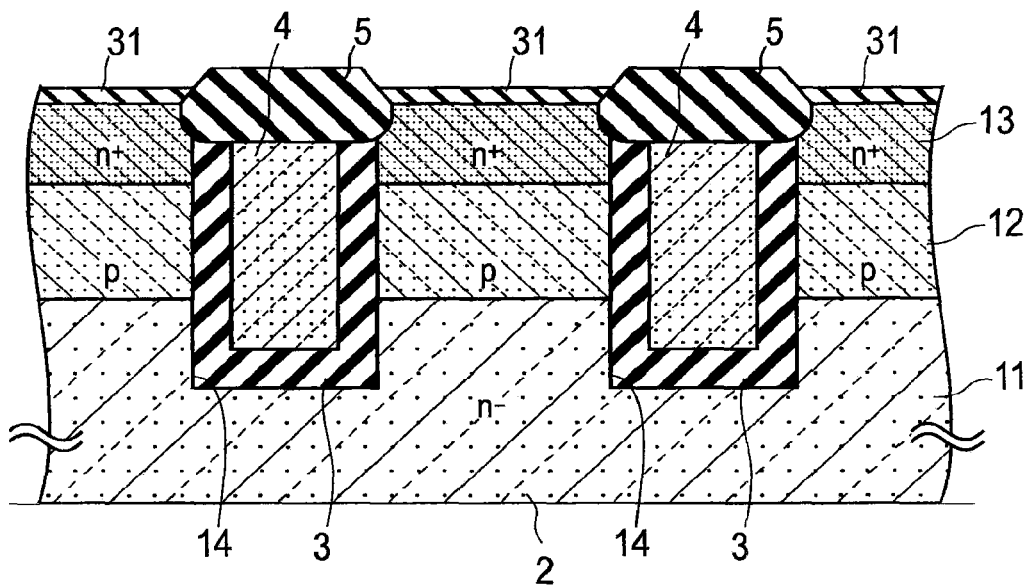
FIG. 28 is a schematic cross-sectional configuration diagram for explaining one process of the fabrication method of the trench type semiconductor device according to the second embodiment of the present invention.

(k) Next, as shown in FIG. 28, the nitride film 32 of the mask layer 33 is removed by etching.

Figure 29:
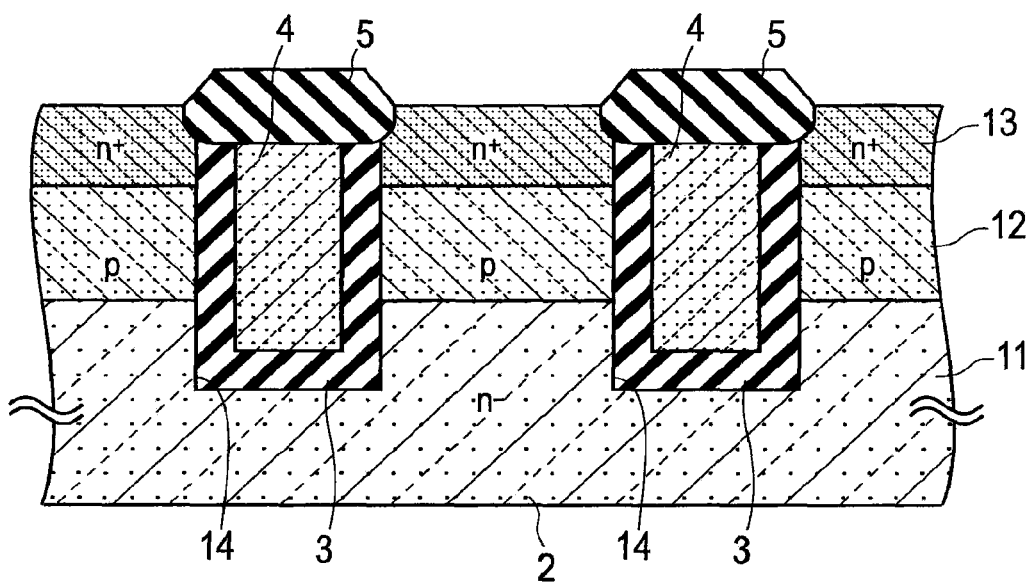
FIG. 29 is a schematic cross-sectional configuration diagram for explaining one process of the fabrication method of the trench type semiconductor device according to the second embodiment of the present invention.

(l) Next, as shown in FIG. 29, the oxide film 31 of the mask layer 33 is removed by etching. Here, a part of interlayer insulating film 5, which make SiO$_2$ as a main constituent, is removed by the etching process. However, the thickness of the interlayer insulating film 5 is extremely large compared with the thickness of the oxide film 31 of the mask layer 33. Accordingly, if it sees from the whole interlayer insulating film 5, the removed interlayer insulating film 5 is very small, and is not a problem.

Figure 30:
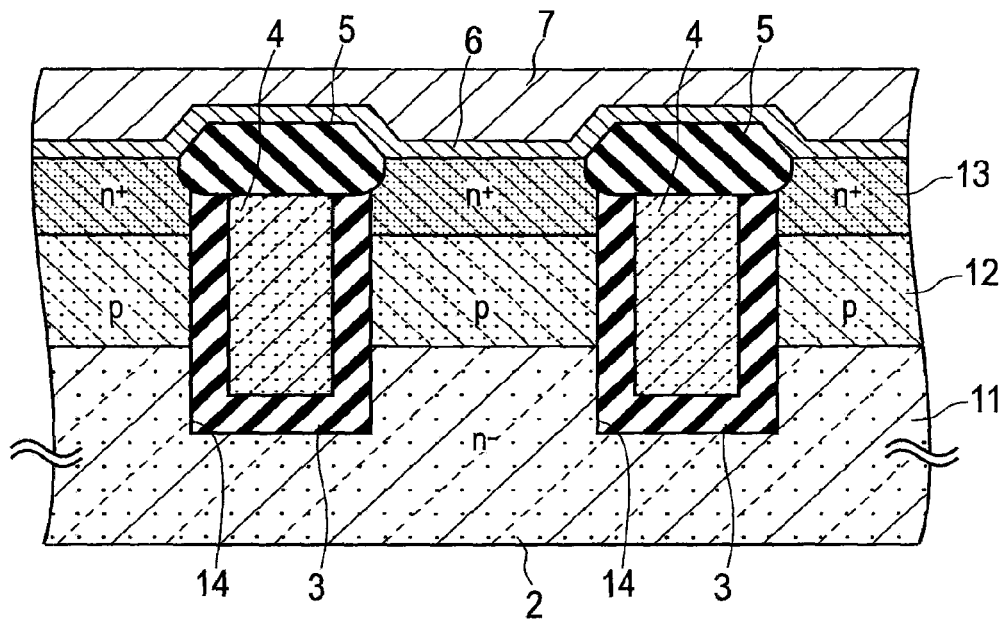
FIG. 30 is a schematic cross-sectional configuration diagram for explaining one process of the fabrication method of the trench type semiconductor device according to the second embodiment of the present invention.

(m) Next, as shown in FIG. 30, the barrier metal layer 6 is formed so that the whole top surface may be covered. Then, the source electrode 7 is formed so that the whole barrier metal layer 6 may be covered.

(n) Finally the drain electrode 8 is formed on the bottom surface of the substrate 2. Accordingly, the trench type semiconductor device 1 shown in FIG. 19 is completed.

As mentioned above, the trench type semiconductor device 1 according to the second embodiment is performing the ion implantation of As (arsenic), which is different from Si (silicon) which is a semiconductor material composing the interlayer insulating film 5, to the interlayer insulating film 5.

Furthermore, in the trench type semiconductor device 1, the impurity concentration of the interlayer insulating film 5 is made larger than the impurity concentration of the regions 12 and 13. Accordingly, in the process of annealing the ion implantation layer 36 and forming the interlayer insulating film 5, since a lot of As (arsenic) is taken in between Si (silicon) atoms of the ion implantation layer 36, the amplification factor of the volume capacity of the interlayer insulating film 5 can be improved.

Accordingly, the insulation by the interlayer insulating film 5 can be improved, and the short circuit between the source electrode 7 and the gate electrode 4 can be suppressed.

Moreover, the interlayer insulating film 5 can be formed by the oxidation and volume expansion by annealing of low temperature and a short time compared with the forming temperature and forming time by the LOCOS method. Accordingly, it can suppress that the impurity atoms are diffused into each regions 11 and 12 and 13 by annealing for forming the interlayer insulating film 5.

As a result, degradation of the element characteristic of the trench type semiconductor device 1 can be suppressed.

Moreover, in the fabrication method of the trench type semiconductor device 1 according to the second embodiment, the mask layer 33 functions as a mask of the process of forming the trench 14, and functions as a mask in the process of forming the interlayer insulating film 5. That is, the trench 14 and the interlayer insulating film 5 can be formed by self-alignment.

Accordingly, since it can suppress that the relative position between the trench 14 and the interlayer insulating film 5 shifts, the interlayer insulating film 5 can be formed in a position with the exact top edge of the trench 14.

Moreover, in the fabrication method of the trench type semiconductor device 1, since the position shift between the trench 14 and the interlayer insulating film 5 can be suppressed, the region with which the interlayer insulating film 5 and the n$^+$ type source layer 13 overlap can be made very small. Accordingly, the interval between the adjoining trenches 14 can be made small, and the integration can be improved.

As a result, the reduction of channel resistance is achievable. That is, in the trench type semiconductor device 1, on resistance can be reduced substantially.

Moreover, in the fabrication method of the trench type semiconductor device 1, the n$^+$ type source layer 13 can be exposed by removing the mask layer 33. As a result, the contact region with the source electrode 7 can be easily formed on the top surface of the n⁺ type source layer 13, without needing a contact mask process.

Other Embodiments

The present invention has been described by the first to second embodiments, as a disclosure including associated description and drawings to be construed as illustrative, not restrictive. With the disclosure, artisan might easily think up alternative embodiments, embodiment examples, or application techniques.

For example, in the first to second embodiments, although the embodiment applied to the MOSFET is described, the present invention may be applied to other trench type semiconductor devices, such as IGBT.

Moreover, the material, the shape, the numerical value, etc. of each configuration in the embodiments mentioned above can be changed suitably.

For example, the element ions implanted into the interlayer insulating film 5 can be applied by B (boron), N (nitrogen), O (oxygen), Ne (neon), P (phosphorus), Ar (argon), Kr (krypton), Sb (antimony), etc. Moreover, the impurity concentration of the element ions implanted into the interlayer insulating film 5 can be suitably changed, if the value of the impurity concentration of the element ions is larger than the impurity concentration of the p type second base layer 12 and the n⁺ type source layer 13 which are formed in the substrate 2. For example, the impurity concentration of the element ions implanted into the interlayer insulating film 5 may be set as the range of about $1.0 \times 10^{14}$ atoms/cm³ to about $1.0 \times 10^{12}$ atoms/cm³, for example.

Moreover, the accelerating energy voltage at the time of implanting the impurity ions into the p type second base layer 12 and the n⁺ type source layer 13 can be suitably changed, if the mask layer 33 can be passed through. For example, the accelerating energy voltage at the time of implanting the impurity ions into the p type second base layer 12 and the n⁺ type source layer 13 may be set as the range of about 20 keV to about 180 keV.

Thus, the present invention includes various embodiments which have not been described in the specification.

INDUSTRIAL APPLICABILITY

The trench type semiconductor device of the present invention is applicable to a DC-DC converter and a PWM inverter at the head of various kinds of AC-AC/AC-DC/DC-DC/DC-AC power converter from small amount of power to large amount of power, etc. More specifically, the trench type semiconductor device of the present invention is applicable to a bridge circuit, an LCD inverter, a motor drives, an HID (High Intensity Discharge lamp) headlight lighting apparatus for automotives, which use the high breakdown voltage MOSFET or IGBT, etc.

REFERENCE SIGNS LIST

1: Trench type semiconductor device;
2: Substrate;
3: Gate insulating film;
3a: LOCOS oxidation film;
4: Gate electrode;
5: Interlayer insulating film (LOCOS insulating film);
6: Barrier metal layer;
7: First main electrode (source electrode, emitter electrode);
8: Second main electrode (drain electrode, collector electrode);
10: Second main electrode layer (drain layer, collector layer);
11: First base layer;
12: Second base layer;
12a: Body contact layer;
13: First main electrode layer (source layer, emitter layer);
14: Trench;
14a: Bottom surface of the trench:
14b: Sidewall surface of the trench;
15: Self-aligned contact trench;
15a: Bottom surface of the self-aligned contact trench;
15b: Sidewall surface of the self-aligned contact trench;
31: Oxide film;
32: Nitride film;
33: Mask layer;
33a: Apertural area;
35: Polysilicon layer; and
36: Ion implantation layer.

The invention claimed is:

1. A trench type semiconductor device comprising:
a first base layer of a first conductivity type having high resistivity;
a gate insulating film placed on a bottom surface and a sidewall surface of a trench formed from a surface of the first base layer;
a gate electrode placed on the gate insulating film and fills up into the trench;
an interlayer insulating film placed by covering the gate electrode;
a second base layer of a second conductivity type placed on the surface of the first base layer, and is formed more shallowly than a bottom surface of the trench;
a first main electrode layer of the first conductivity type placed on a surface of the second base layer;
a first main electrode is connected to the second base layer in a bottom surface of a self-aligned contact trench, and is connected to the first main electrode layer in a sidewall surface of the self-aligned contact trench, the self-aligned contact trench being configured to pass through the first main electrode layer and being formed in the second base layer by applying the interlayer insulating film as a mask, the first main electrode being disposed all over a device structure toward the self-aligned contact trench;
a second main electrode layer placed at a back side of the first base layer; and
a second main electrode placed at the second main electrode layer;
wherein the interlayer insulating film includes arsenic implanted by ion implantation as an impurity, and an impurity concentration of arsenic in the interlayer insulating film is higher than impurity concentrations of the first base layer, the second base layer, and the first main electrode layer.

2. The trench type semiconductor device according to claim 1, wherein
the interlayer insulating film is formed with a LOCOS oxidation film, and is placed by covering a part of the gate insulating film and a part of the first main electrode layer.

3. The trench type semiconductor device according to claim 1, wherein
the bottom surface of the self-aligned contact trench is provided with a body contact layer with the second conductivity type whose impurity concentration is higher than the second base layer.

4. The trench type semiconductor device according to claim 1, wherein the first main electrode is placed all over a device surface.

5. The trench type semiconductor device according to claim 1, wherein the first main electrode provides with a barrier metal layer on an underlying.

6. The trench type semiconductor device according to claim 1, wherein in the first base layer and the second base layer, a surface orientation is (100).

7. The trench type semiconductor device according to claim 1, wherein the trench formed in the first base layer has a rectangular plane pattern.

8. The trench type semiconductor device according to claim 1, wherein both the bottom surface and the sidewall surface of the trench formed in the first base layer have the surface orientation of (100).

9. The trench type semiconductor device according to claim 1, wherein both the bottom surface and the sidewall surface of the self-aligned contact trench have the surface orientation of (100).

10. The trench type semiconductor device according to claim 1, wherein the self-aligned contact trench has a lattice-like pattern.

11. The trench type semiconductor device according to claim 1, wherein the self-aligned contact trench has a zigzagged lattice-like pattern.

12. The trench type semiconductor device according to claim 1, wherein the self-aligned contact trench has a stripe shaped pattern.

* * * * *